(12) United States Patent
Fukasawa

(10) Patent No.: US 11,798,965 B2
(45) Date of Patent: Oct. 24, 2023

(54) SOLID-STATE IMAGING DEVICE AND METHOD FOR MANUFACTURING THE SAME

(71) Applicant: SONY SEMICONDUCTOR SOLUTIONS CORPORATION, Kanagawa (JP)

(72) Inventor: Masanaga Fukasawa, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 184 days.

(21) Appl. No.: 16/770,723

(22) PCT Filed: Dec. 6, 2018

(86) PCT No.: PCT/JP2018/044825
§ 371 (c)(1),
(2) Date: Jun. 8, 2020

(87) PCT Pub. No.: WO2019/124085
PCT Pub. Date: Jun. 27, 2019

(65) Prior Publication Data
US 2021/0167106 A1 Jun. 3, 2021

(30) Foreign Application Priority Data
Dec. 20, 2017 (JP) ................ 2017-243842

(51) Int. Cl.
*H01L 27/00* (2006.01)
*H01L 27/146* (2006.01)
*H04N 25/76* (2023.01)

(52) U.S. Cl.
CPC .... *H01L 27/14621* (2013.01); *H01L 27/1469* (2013.01); *H01L 27/14609* (2013.01);
(Continued)

(58) Field of Classification Search
CPC ......... H01L 27/14634; H01L 27/14636; H01L 21/76831; H01L 21/76834; H01L 21/76877
See application file for complete search history.

(56) References Cited

U.S. PATENT DOCUMENTS

2003/0181032 A1* 9/2003 Kawano ............ H01L 21/76838
257/E21.585
2004/0180532 A1* 9/2004 Shue ................. H01L 21/76849
438/626

(Continued)

FOREIGN PATENT DOCUMENTS

CN 102867847 A 1/2013
JP 2000-332107 A 11/2000
(Continued)

OTHER PUBLICATIONS

International Search Report and Written Opinion of PCT Application No. PCT/JP2018/044825, dated Feb. 19, 2019, 08 pages of ISRWO.

*Primary Examiner* — Reema Patel
(74) *Attorney, Agent, or Firm* — CHIP LAW GROUP

(57) ABSTRACT

Provided is a solid-state imaging device capable of reducing bonding defects when two substrates are bonded to each other, and a method for manufacturing the solid-state imaging device. The solid-state imaging device includes a first substrate including a first electrode formed with a metal, and a second substrate that is a substrate bonded to the first substrate, the second substrate including a second electrode formed with a metal, the second electrode being bonded to the first electrode. In at least one of the first substrate or the second substrate, a diffusion preventing layer of the metal is formed for a layer formed with the metal filling a hole portion, the metal forming the electrodes.

12 Claims, 18 Drawing Sheets

(52) U.S. Cl.
CPC .. *H01L 27/14636* (2013.01); *H01L 27/14683* (2013.01); *H04N 25/76* (2023.01)

(56) References Cited

U.S. PATENT DOCUMENTS

| | | | |
|---|---|---|---|
| 2013/0009321 A1 | 1/2013 | Kagawa et al. | |
| 2015/0364420 A1* | 12/2015 | Lin | H01L 23/485 |
| | | | 438/668 |

FOREIGN PATENT DOCUMENTS

| | | |
|---|---|---|
| JP | 2003-124311 A | 4/2003 |
| JP | 2012-142414 A | 7/2012 |
| JP | 2013-033900 A | 2/2013 |
| KR | 10-2013-0007972 A | 1/2013 |
| TW | 201304064 A | 1/2013 |

\* cited by examiner

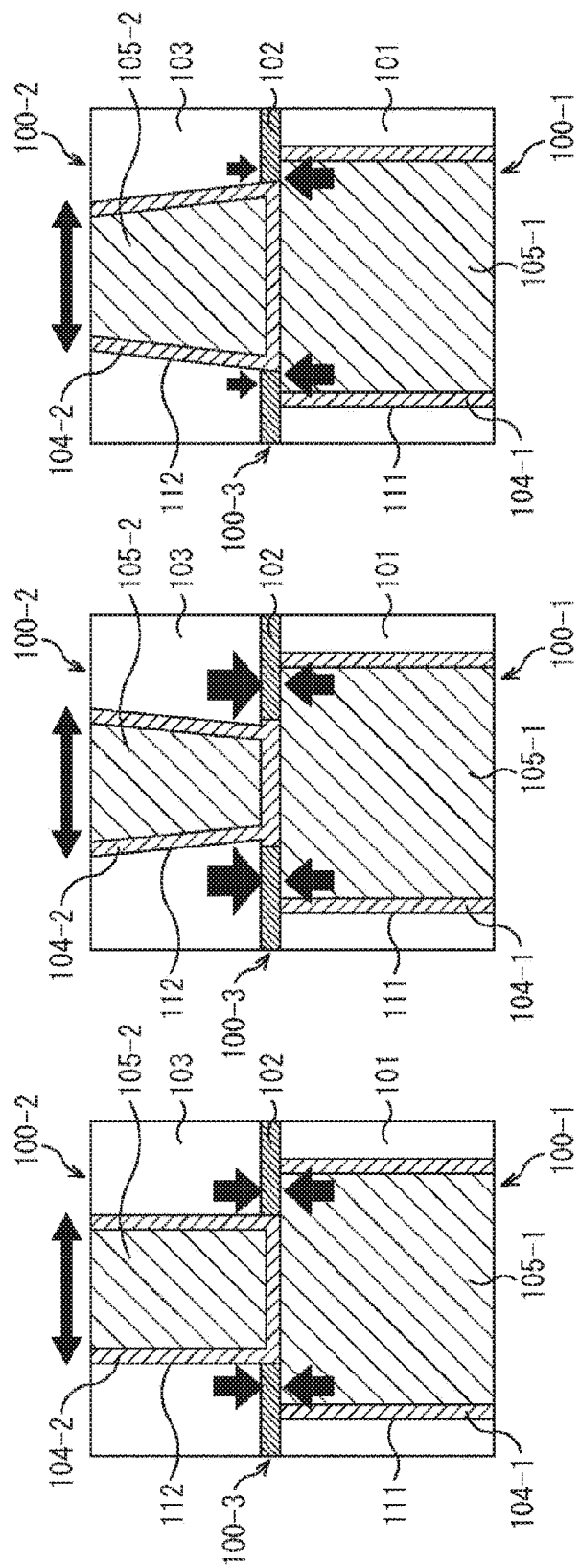

SOLID-STATE IMAGING DEVICE AND METHOD FOR MANUFACTURING THE SAME

CROSS REFERENCE TO RELATED APPLICATIONS

This application is a U.S. National Phase of International Patent Application No. PCT/JP2018/044825 filed on Dec. 6, 2018, which claims priority benefit of Japanese Patent Application No. JP 2017-243842 filed in the Japan Patent Office on Dec. 20, 2017. Each of the above-referenced applications is hereby incorporated herein by reference in its entirety.

TECHNICAL FIELD

The present technology relates to a solid-state imaging device and a method for manufacturing the solid-state imaging device, and more particularly, to a solid-state imaging device capable of reducing bonding defects when two substrates are bonded to each other, and a method for manufacturing the solid-state imaging device.

BACKGROUND ART

Higher integration of semiconductor devices of two-dimensional structures has been realized through introduction of fine processing and enhancement of packaging density. However, there are physical limitations to higher integration of two-dimensional structures by these methods. Therefore, to further reduce the sizes of semiconductor devices and increase the pixel density, semiconductor devices having three-dimensional structures are being developed.

For example, Patent Document 1 discloses a stack semiconductor device in which two semiconductor devices are stacked. Patent Document 1 also discloses a technique of providing a buffer for adjusting the stress to be caused by a through electrode. Further, Patent Document 2 discloses a technique for reducing diffusion of copper (Cu) in a semiconductor device by preventing the main conductor film made of copper (Cu) from being brought into contact with the upper surface (CMP surface) of an insulating film.

CITATION LIST

Patent Documents

Patent Document 1: Japanese Patent Application Laid-Open No. 2012-142414
Patent Document 2: Japanese Patent Application Laid-Open No. 2003-124311

SUMMARY OF THE INVENTION

Problems to be Solved by the Invention

Meanwhile, in a solid-state imaging device as a semiconductor device having a three-dimensional structure, if a pumping phenomenon (Cu pumping) occurs due to the heat treatment after bonding when two substrates are stacked and bonded to each other, the wafer bonding become inadequate, and bonding defects might appear. Therefore, there has been a demand for a technique for reducing bonding defects when two substrates are laminated and bonded to each other.

The present technology has been made in view of such circumstances, and aims to reduce bonding defects when two substrates are bonded to each other.

Solutions to Problems

A solid-state imaging device according to one aspect of the present technology is a solid-state imaging device that includes: a first substrate including a first electrode formed with a metal; and a second substrate that is a substrate bonded to the first substrate, the second substrate including a second electrode formed with a metal, the second electrode being bonded to the first electrode. In at least one of the first substrate or the second substrate, a diffusion preventing layer of the metal is formed for a layer formed with the metal filling a hole portion, the metal forming the electrodes.

In the solid-state imaging device according to one aspect of the present technology, the diffusion preventing layer of the metal is formed for the layer in which the metal forming the electrodes is buried in the hole portion in at least one of the first substrate including the first electrode formed with a metal, or the second substrate that is the substrate bonded to the first substrate, the second substrate including the second electrode formed with the metal, the second electrode being bonded to the first electrode.

A manufacturing method according to one aspect of the present technology is a method for manufacturing a solid-state imaging device that includes: a first substrate including a first electrode formed with a metal; and a second substrate that is a substrate bonded to the first substrate, the second substrate including a second electrode formed with a metal, the second electrode being bonded to the first electrode. The method includes: forming a first layer in which the metal is buried in a first hole portion; forming a diffusion preventing layer of the metal, the diffusion preventing layer being stacked on the first layer; and forming a second layer in which the metal is buried in a second hole portion to form a connecting pad portion, the second layer being stacked on the first layer and the diffusion preventing layer, the first layer, the diffusion preventing layer, and the second layer being formed in at least one of the first substrate or the second substrate.

In the manufacturing method according to one aspect of the present technology, the first layer in which the metal is buried in the first hole portion is formed, the diffusion preventing layer of the metal is formed so as to be stacked on the first layer, and the second layer in which the metal is buried in the second hole portion to form the connecting pad portion is formed so as to be stacked on the first layer and the diffusion preventing layer. The first layer, the diffusion preventing layer, and the second layer are formed in at least one of the first substrate including the first electrode formed with the metal, or the second substrate bonded to the first substrate, the second substrate including the second electrode formed with the metal, the second electrode being bonded to the first electrode.

Effects of the Invention

According to one aspect of the present technology, bonding defects can be reduced when two substrates are bonded to each other.

Note that the effects of the present technology are not limited to the effect described herein, and may include any of the effects described in the present disclosure.

BRIEF DESCRIPTION OF DRAWINGS

FIGS. 5A, 5B, and 5C are diagrams showing example sizes of the upper surface and the lower surface of the via in the second layer.

MODE FOR CARRYING OUT THE INVENTION

The following is a description of embodiments of the present technology, with reference to the drawings. Note that explanation will be made in the following order.

1. General Example Configuration of a Solid-State Imaging Device
2. First Embodiment
3. Second Embodiment
4. Specific Example Configurations of Solid-State Imaging Devices
5. Example Configuration of an Electronic Apparatus
6. Examples of Use of the Solid-State Imaging Device
7. Example Application to an In-Vivo Information Acquisition System
8. Example Application to an Endoscopic Surgery System
9. Example Applications to Moving Objects

1. General Example Configuration of a Solid-State Imaging Device

Figure 1:
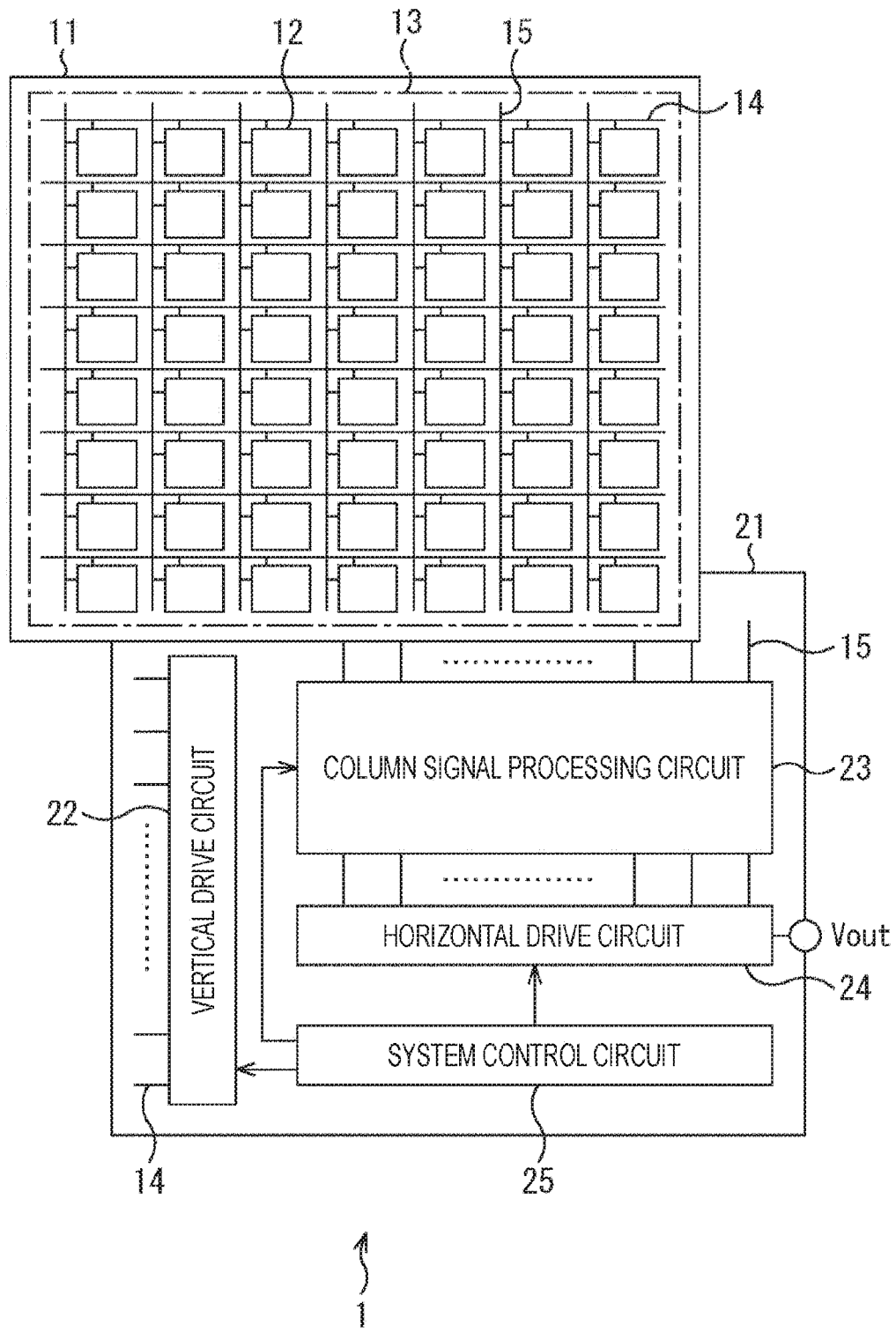
FIG. 1 is a diagram showing the configuration of an embodiment of a solid-state imaging device to which the present technology is applied.

FIG. 1 is a diagram showing the configuration of an embodiment of a solid-state imaging device to which the present technology is applied.

In FIG. 1, a solid-state imaging device 1 is a semiconductor device having a three-dimensional structure that includes a first substrate 11 as a sensor substrate and a second substrate 21 as a circuit substrate bonded to the first substrate 11 in a stacked state. This solid-state imaging device 1 is designed as an image sensor, such as a complementary metal oxide semiconductor (CMOS) image sensor, for example.

In the solid-state imaging device 1, the first substrate 11 has a pixel region 13 in which a plurality of pixels 12 including photoelectric conversion units is two-dimensionally arranged in a regular pattern. In this pixel region 13, a plurality of pixel drive lines 14 is arranged in the row direction, and a plurality of vertical signal lines 15 is arranged in the column direction, so that each pixel 12 is connected to one pixel drive line 14 and one vertical signal line 15.

Further, each pixel 12 includes a photoelectric conversion unit, a floating diffusion region (FD), and a pixel circuit formed with a plurality of pixel transistors and the like. Note that a plurality of the pixels 12 may share part of a pixel circuit in some cases.

On the other hand, peripheral circuits such as a vertical drive circuit 22, a column signal processing circuit 23, a horizontal drive circuit 24, and a system control circuit 25 are formed in the second substrate 21.

While the solid-state imaging device 1 is formed with the first substrate 11 and the second substrate 21 bonded to each other, it is known that a so-called pumping phenomenon (Cu pumping) occurs during a heat treatment (annealing treatment) after bonding those substrates, and the copper (Cu) used for the electrodes expands (bulges). Due to the local copper (Cu) bulging phenomenon caused by this heat treatment (or due to plastic deformation caused by thermal stress), the wafer bonding strength decreases, and the bonding becomes inadequate, which might lead to defective electrical connection or peeling.

(Bonding Portion at the Time of a Pumping Phenomenon)

Figure 2:
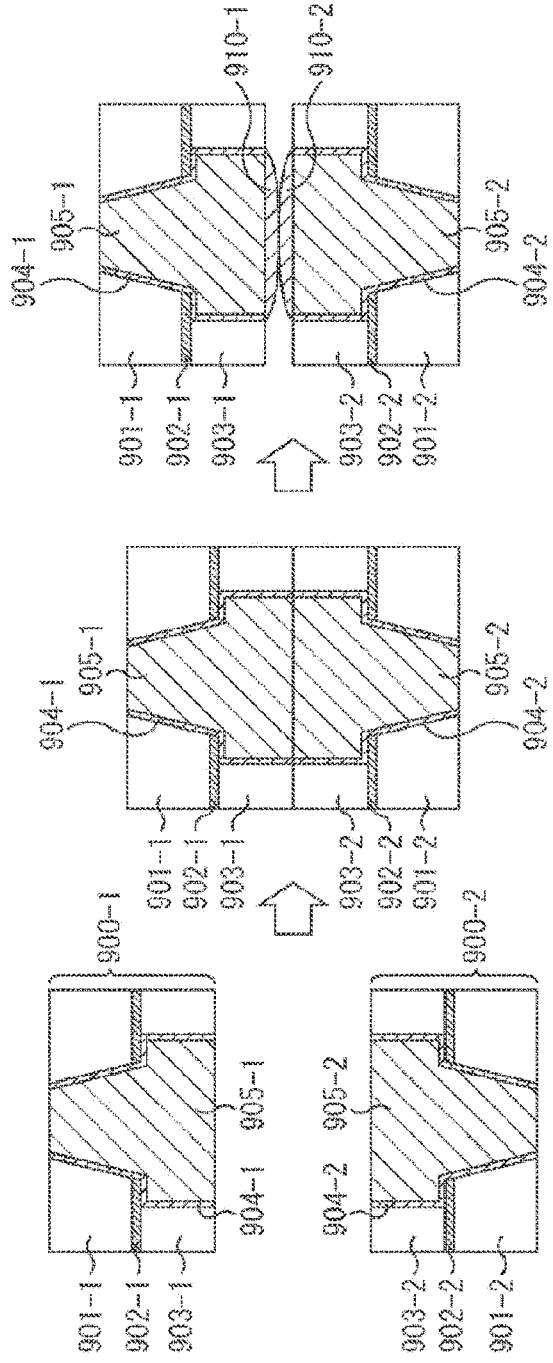
FIGS. 2A, 2B, and 2C are cross-sectional diagrams showing the state of the bonding portion when a pumping phenomenon occurs while two substrates are bonded to each other.

FIGS. 2A, 2B, and 2C are cross-sectional diagrams showing the state of the bonding portion between electrodes when a pumping phenomenon occurs while two substrates are bonded to each other.

As shown in FIG. 2A, a laminated film 900-1 in which an interlayer insulating film 901-1, a liner insulating film 902-1, and an interlayer insulating film 903-1 are stacked is formed in the upper substrate of the two substrates to be bonded. A metallic film 905-1 made of copper (Cu) is formed as an electrode in the laminated film 900-1. Note that a metal seed film 904-1 is formed between the laminated film 900-1 and the metallic film 905-1.

Meanwhile, in the lower substrate, copper (Cu) as a metallic film 905-2 is formed in a laminated film 900-2 in which an interlayer insulating film 901-2 through an interlayer insulating film 903-2 are stacked, in a similar manner as in the upper substrate.

FIG. 2B shows the structure of the bonding portion between the two substrates after bonding. Then, a heat treatment is then performed in the state of the bonding portion shown in FIG. 2B, so that the bonding portion enters a state shown in FIG. 2C. That is, the heat treatment causes a pumping phenomenon, and the copper (Cu) as the metallic films 905-1 and 905-2 formed in the laminated films 900-1 and 900-2 of the upper and lower substrates expands (910-1 and 910-2 in the drawing).

As described above, when such a pumping phenomenon occurs, the wafer bonding strength decreases, and the bonding becomes inadequate, which might lead to defective electrical bonding. In view of the above, the present technology suggests a solution for reducing the bonding defects, to enable reduction of defects in the electrode bonding when two substrates are bonded to each other.

In the description below, such solutions will be described with reference to two embodiments: a first embodiment and a second embodiment.

2. First Embodiment (Structure of the Bonding Portion)

Figure 3:
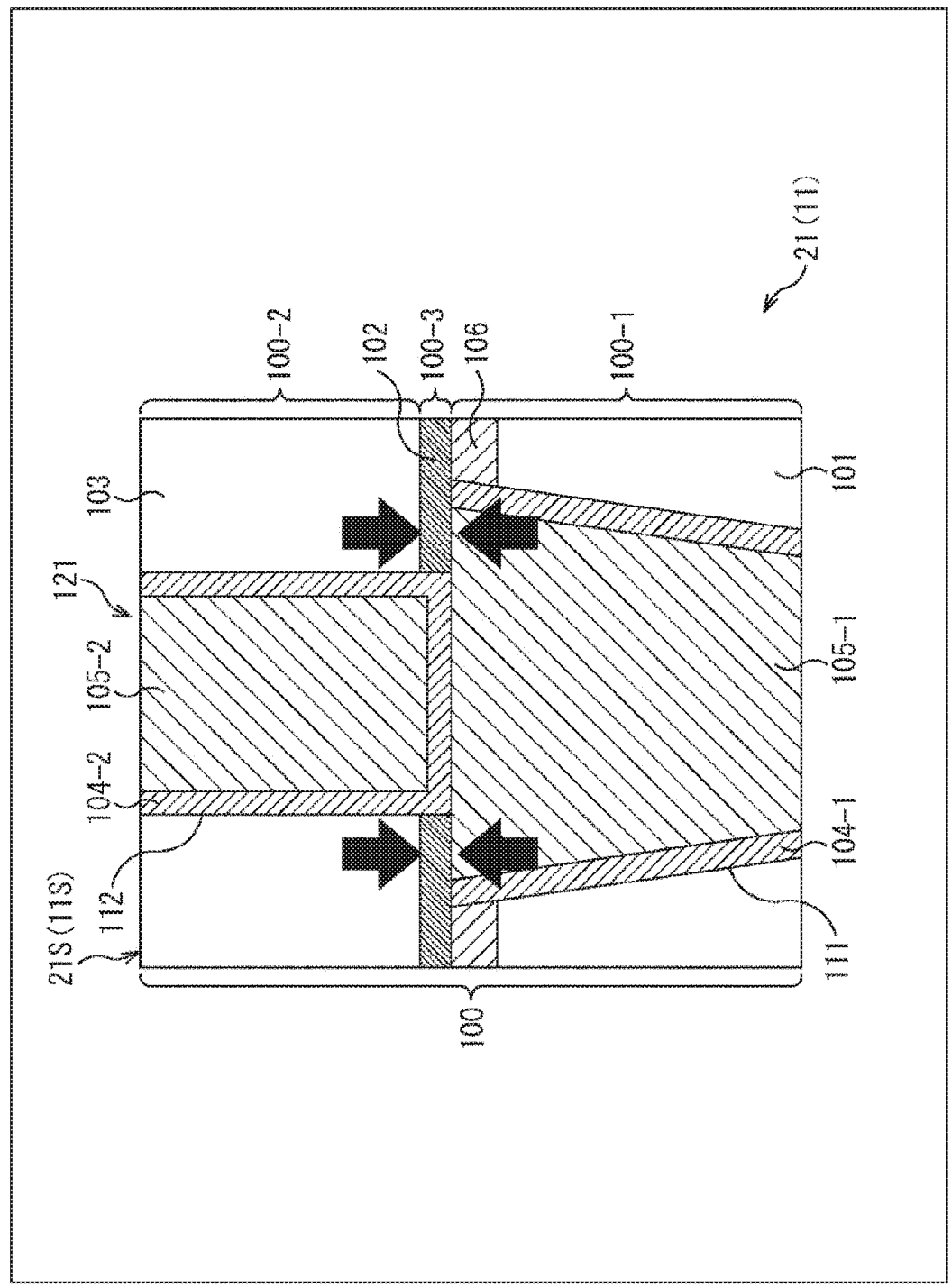
FIG. 3 is a cross-sectional view of relevant parts, showing the structure of a solid-state imaging device according to a first embodiment.

FIG. 3 is a cross-sectional view of relevant parts, showing the structure of a solid-state imaging device 1 according to the first embodiment. In the description below, the configuration of the solid-state imaging device 1 according to the first embodiment is specifically described, with reference to the cross-sectional view of the relevant parts.

Note that, of the first substrate 11 and the second substrate 21 bonded in the solid-state imaging device 1, the second substrate 21 will be described as a typical example with reference to FIG. 3, but the first substrate 11 may have a similar structure (the structure of the first embodiment). Further, the surface on the upper side in the drawing is a bonding surface 21S of the second substrate 21 or a bonding surface 11S of the first substrate 11.

In FIG. 3, a laminated film 100 in which a first layer 100-1 and a second layer 100-2 are stacked is formed in the second substrate 21.

The first layer 100-1 includes an interlayer insulating film 101 made of silicon oxide (SiO$_2$) or the like. Note that the coefficient of thermal expansion (CTE) of silicon oxide (SiO$_2$) is 0.5×10$^{-6}$/K.

In the first layer 100-1, a via 111 as a first hole portion is formed in the interlayer insulating film 101, and a metallic film 105-1 is buried therein. Note that, in the case explained in the description below, copper (Cu) is used as the metallic film 105-1. Copper (Cu) has a coefficient of thermal expansion of 16.5×10$^{-6}$/K.

Further, in the first layer 100-1, a metal seed film 104-1 as a barrier metal is formed between the side surface of the via 111 and the metallic film 105-1. The metal seed film 104-1 may be a film formed with tantalum (Ta), titanium (Ti), or the like, for example. Note that the coefficient of thermal expansion of tantalum (Ta) is 6.3×10$^{-6}$/K. Further, the coefficient of thermal expansion of titanium (Ti) is 8.6×10$^{-6}$/K.

Meanwhile, the second layer 100-2 stacked as the upper layer on the first layer 100-1 as the lower layer includes an interlayer insulating film 103 made of silicon oxide (SiO$_2$) or the like. In the second layer 100-2, a via 112 as a second hole portion is formed in the interlayer insulating film 103, and a metallic film 105-2 made of copper (Cu) is buried therein.

That is, in the second layer 100-2, the metallic film 105-2 is buried in the via 112, so that a pad portion 121 made of copper (Cu) is formed on the side of the bonding surface 21S. Note that, in the second layer 100-2, a metal seed film 104-2 made of tantalum (Ta), titanium (Ti), or the like is also formed between the side surface of the via 112 and the metallic film 105-2.

Here, in the laminated film 100, a diffusion preventing layer 100-3 is formed between the first layer 100-1 and the second layer 100-2.

The diffusion preventing layer 100-3 includes a diffusion preventing film 102. The diffusion preventing film 102 is an insulating film, and is a film formed with a silicon compound such as silicon nitride (SiN), silicon carbonitride (SiCN), or silicon carbide (SiC), for example. Note that the coefficient of thermal expansion of silicon nitride (SiN) is 2.8×10$^{-6}$/K. Further, the coefficient of thermal expansion of silicon carbide (SiC) is 3.7×10$^{-6}$/K.

The diffusion preventing film 102 is formed under the interlayer insulating film 103 of the second layer 100-2 as the upper layer (under the region excluding the metal seed film 104-2 and the metallic film 105-2 formed in the via 112), so as to be in contact with the metal seed film 104-1 formed on the side surface of the via 111 of the first layer 100-1 as the lower layer and part of the metallic film 105-1.

Note that, in the first layer 100-1, a hard mask 106 is formed on the interlayer insulating film 101, and is in contact with the diffusion preventing film 102 of the diffusion preventing layer 100-3. However, the hard mask 106 is not necessarily formed.

Further, the metal seed film 104-2 is formed not only between the side surface of the via 112 and the metallic film 105-2, but also in the region under the metallic film 105-2. That is, the metal seed film 104-2 is also formed between the metallic film 105-2 buried in the via 112 of the second layer 100-2 and the metallic film 105-1 buried in the via 111 of the first layer 100-1, and forms part of the diffusion preventing layer 100-3.

As described above, in the second substrate 21, the diffusion preventing layer 100-3 including the diffusion preventing film 102 and part of the metal seed film 104-2 is formed between the first layer 100-1 and the second layer 100-2, and functions as a "support" that reduces volume expansion of the copper (Cu) serving as the metallic film 105-1 buried in the via 111 of the first layer 100-1 as the lower layer.

Then, the diffusion preventing layer 100-3 then reduces thermal expansion of the metallic film 105-1 of copper (Cu) during the heat treatment after the bonding of the bonding surfaces (11S and 21S) of the first substrate 11 and the second substrate 21. As a result, it becomes possible to prevent a copper (Cu) pumping phenomenon (Cu pumping) from occurring in the bonding surface 21S (or the bonding surface 11S).

Further, as such a structure is adopted, the total volume of the copper (Cu) used as the metallic films 105-1 and 105-2 can also be reduced. That is, in contrast to the structure of the laminated film 900-1 or the laminated film 900-2 shown in FIGS. 2A, 2B, and 2C described above, for example, the diffusion preventing film 102 is formed so that the diameter of the via 112 of the second layer 100-2 is smaller than the diameter of the via 111 of the first layer 100-1 in the structure of the laminated film 100 shown in FIG. 3. As a result, the total volume of the copper (Cu) can be made smaller.

Note that, in FIG. 3, the prevention of a pumping phenomenon is indicated by four arrows in the drawing. That is, in FIG. 3, the two arrows pointing to the upper side from the lower side in the drawing indicate thermal expansion of the copper (Cu) serving as the metallic film 105-1 buried in the via 111 of the first layer 100-1. On the other hand, the two arrows that face those arrows and point to the lower side from the upper side in the drawing indicate that (the diffusion preventing film 102 of) the diffusion preventing layer 100-3 reduces thermal expansion of the copper (Cu) serving as the metallic film 105-1.

As described above, in the structure of the solid-state imaging device 1 according to the first embodiment, the diffusion preventing layer 100-3 is formed between the first layer 100-1 and the second layer 100-2, so that copper (Cu) bonding defects due to thermal expansion of the copper (Cu) during the heat treatment after the bonding can be reduced.

Particularly, in a case where the substrates to be stacked are connected by a through silicon electrode (through silicon via: TSV), the via of the through silicon electrode (TSV) has a great diameter and a great depth. Accordingly, the volume of the copper (Cu) buried therein is large. For example, in the above described structure shown in FIGS. 2A, 2B, and 2C (a Cu wiring structure in which a wiring layer and a connecting hole layer are connected), the volume of the copper (Cu) becomes larger during the heat treatment after the bonding. Therefore, the amount of bulging at the time of a temperature rise becomes larger. As a result, bonding the pad portions (Cu—Cu bonding) becomes difficult.

In the structure of the present technology shown in FIG. 3, on the other hand, a "support" that restricts movement of the copper (Cu) buried in the lower layer is formed between the upper wiring layer (the second layer 100-2) and the lower connecting hole layer (the first layer 100-1), or the total volume of the copper (Cu) is reduced. Thus, it is possible to reduce copper (Cu) bonding defects due to thermal expansion of the copper (Cu) during the heat treatment after the bonding.

Note that, although the structure of the second substrate 21 has been described herein as mentioned above, the first substrate 11 can have a similar structure to reduce copper (Cu) bonding defects due to thermal expansion. Then, the first substrate 11 and the second substrate 21 are then bonded to each other, so that a through silicon electrode (TSV) is formed in the first substrate 11 and the second substrate 21, which have been stacked. At that point of time, the pad portions can be bonded (Cu—Cu bonding) with precision.

However, the structure shown in FIG. 3 can be adopted in at least one substrate between the first substrate 11 and the second substrate 21. Even in a case where the structure shown in FIG. 3 is adopted only in either the first substrate 11 or the second substrate 21, copper (Cu) bonding defects due to thermal expansion can be reduced in at least one of the substrates.

Note that, in the structure shown in FIG. 3, the diffusion preventing layer 100-3 includes part of the metal seed film 104-2, but the metal seed film 104-2 is not necessarily included therein.

(Various Example Combinations of Upper Surface Shapes of the Vias)

FIGS. 4A, 4B, 4C, and 4D are diagrams showing various example combinations of the upper surface shape of the via 111 of the first layer 100-1 and the upper surface shape of the via 112 of the second layer 100-2. Note that FIGS. 4A, 4B, 4C, and 4D show the upper surface shapes of the vias in a case where the first layer 100-1 and the second layer 100-2 are viewed from the bonding surface 21S (or the bonding surface 11S) (or in a plan view).

Here, example combinations of the upper surface shape of the via 111 formed in the first layer 100-1 and the upper surface shape of the via 112 formed in the second layer 100-2 are shown in FIGS. 4A, 4B, 4C, and 4D.

Figure 4D:
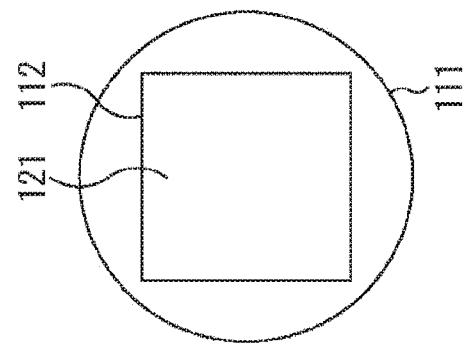
FIGS. 4A, 4B, 4C, and 4D are diagrams showing various example combinations of the upper surface shape of the via of a first layer and the upper surface shape of the via of a second layer.
Figure 4C:
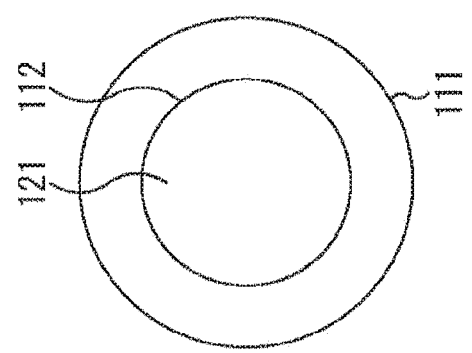
Figure 4B:
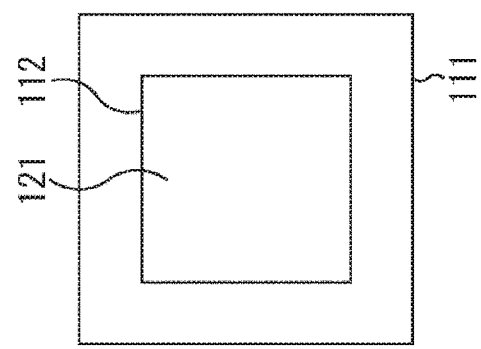
Figure 4A:
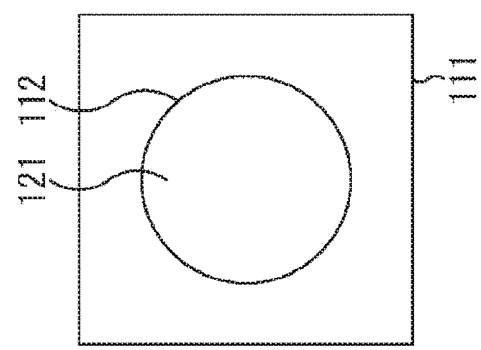

In FIG. 4A, the upper surface of the via 111 formed in the first layer 100-1 has a square shape. On the other hand, the upper surface of the via 112 formed in the second layer 100-2 has a circular shape. Accordingly, the connecting pad portion 121 also has a circular shape. Here, the area of the upper surface of the via 112 (the area of a circle) is smaller than the area of the upper surface of the via 111 (the area of a square).

In FIG. 4B, the upper surface of the via 111 formed in the first layer 100-1 has a square shape. Meanwhile, the shape of the pad portion 121 on the upper surface of the via 112 formed in the second layer 100-2 also has a square shape. Here, the area of the upper surface of the via 112 (the area of a square) is smaller than the area of the upper surface of the via 111 (the area of a square).

In FIG. 4C, the upper surface of the via 111 formed in the first layer 100-1 has a circular shape. Meanwhile, the shape of the pad portion 121 on the upper surface of the via 112 formed in the second layer 100-2 also has a circular shape. Here, the area of the upper surface of the via 112 (the area of a circle) is smaller than the area of the upper surface of the via 111 (the area of a circle).

In FIG. 4D, the upper surface of the via 111 formed in the first layer 100-1 has a circular shape. Meanwhile, the shape of the pad portion 121 on the upper surface of the via 112 formed in the second layer 100-2 has a square shape. Here, the area of the upper surface of the via 112 (the area of a square) is smaller than the area of the upper surface of the via 111 (the area of a circle).

As described above, various combinations of shapes can be adopted as the combination of the upper surface shape of the via 111 formed in the first layer 100-1 and the upper surface shape of the via 112 formed in the second layer 100-2. However, the diameter of the via 112 in the second layer 100-2 is smaller than the diameter of the via 111 in the first layer 100-1.

In other words, a result of comparison between the sizes of the longest portions of the upper surface shape of the via 111 and the upper surface shape of the via 112 shows that the Cu wiring line on the upper surface of the via 111 is longer than the Cu wiring line on the upper surface of the via 112.

Note that the combinations of shapes shown in FIGS. 4A, 4B, 4C, and 4D are merely examples, and any shape pattern that can be generated during the photolithography process may be adopted. That is, the diameter of the via 111 in the first layer 100-1 and the diameter of the via 112 in the second layer 100-2 may be the same or may be different.

(Example Sizes of the Upper Surface and the Lower Surface of the Via in the Second Layer)

FIGS. 5A, 5B, and 5C show example sizes of the upper surface and the lower surface of the via 112 in the second layer 100-2. Note that FIGS. 5A, 5B, and 5C show cross-sectional structures of laminated films 100 each including a first layer 100-1, a second layer 100-2, and a diffusion preventing layer 100-3.

Here, examples sizes of the upper surface and the lower surface (dimensions of the upper and lower portions) of the via 112 in the second layer 100-2 are shown in FIGS. 5A, 5B, and 5C. However, in FIGS. 5A, 5B, and 5C, the size of the upper surface (the bonding surface) (the dimension of the upper portion) of the via 112 is fixed at a constant value (arrows pointing to the right and the left in the drawing), and the size of the lower surface (the surface on the opposite side from the bonding surface) (the dimension of the lower portion) of the via 112 is variable. Comparisons are made in cases where the size of the lower surface of the via 112 is varied.

In FIG. 5A, the upper surface and the lower surface of the via 112 formed in the second layer 100-2 have the same size. Here, the two arrows pointing to the upper side from the lower side in the drawing indicate thermal expansion of the copper (Cu) serving as the metallic film 105-1 buried in the via 111 of the first layer 100-1. On the other hand, the two arrows that face those arrows and point to the lower side from the upper side in the drawing indicate that (the diffusion preventing film 102 of) the diffusion preventing layer 100-3 reduces thermal expansion of the copper (Cu) serving as the metallic film 105-1.

In FIG. 5B, the size of the lower surface of the via 112 formed in the second layer 100-2 is smaller than the size of the upper surface thereof. In this case, as indicated by the arrows in the drawing, the arrows that face the two arrows indicating thermal expansion of the copper (Cu) (the arrows pointing to the upper side from the lower side in the drawing) are larger than the arrows shown in FIG. 5A.

This is because, in the structure in FIG. 5B, the size of the lower surface of the via 112 is smaller, so that the region of the diffusion preventing film 102 can be larger (can protrude more greatly) with respect to the metallic film 105-1 accordingly. Therefore, it is safe to say that the structure in FIG. 5B is a structure superior to the structure in FIG. 5A in reducing thermal expansion of the copper (Cu) serving as the metallic film 105-1.

In FIG. 5C, the size of the lower surface of the via 112 formed in the second layer 100-2 is larger than the size of the upper surface thereof. In this case, as indicated by the arrows in the drawing, the arrows that face the two arrows indicating thermal expansion of the copper (Cu) (the arrows pointing to the upper side from the lower side in the drawing) are smaller than the arrows shown in FIG. 5A.

This is because, in the structure in FIG. 5C, the size of the lower surface of the via 112 is larger, so that the region of the diffusion preventing film 102 can be narrower with respect to the metallic film 105-1 accordingly. Therefore, it is safe to say that the structure in FIG. 5C is a structure inferior to the structure in FIG. 5A in reducing thermal expansion of the copper (Cu) serving as the metallic film 105-1.

Figure 6:
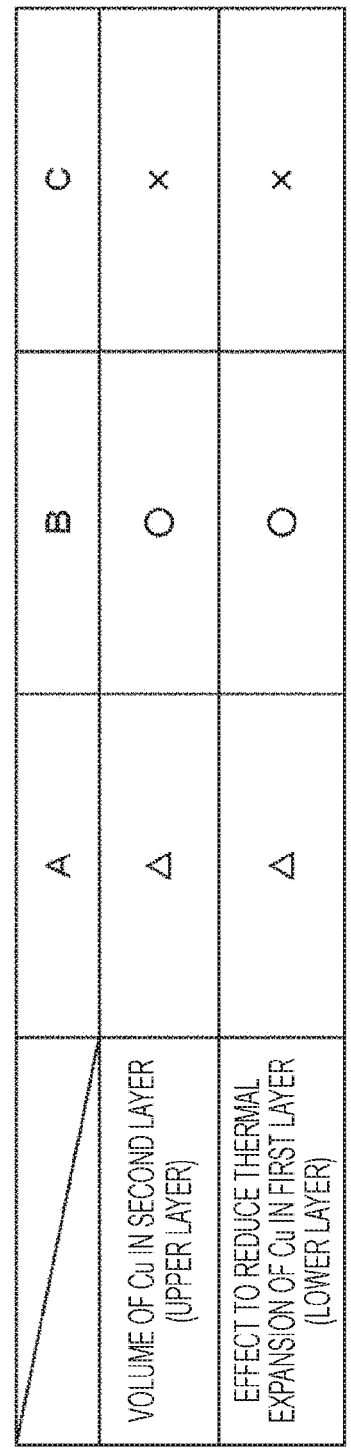
FIG. 6 is a table showing the results of comparisons among the structures of FIGS. 5A, 5B, and 5C.

The above facts can be summarized as shown in FIG. 6, for example. That is, FIG. 6 shows the results of comparisons among the structures shown in FIGS. 5A, 5B, and 5C: the top row shows the results of comparisons of the volume of the copper (Cu) serving as the metallic film 105-2 buried in the via 112 formed in the second layer 100-2 as the upper layer; and the bottom row shows the results of comparisons of the effect to reduce thermal expansion of the copper (Cu) serving as the metallic film 105-1 buried in the via 111 formed in the first layer 100-1 as the lower layer.

As shown in the top row in FIG. 6, the volume of the copper (Cu) in the upper layer is the smallest in the structure shown in FIG. 5B, and is the second smallest in the structure shown in FIG. 5A. Further, the volume of the copper (Cu) in the upper layer is the largest in the structure shown in FIG. 5C.

Furthermore, as shown in the bottom row in FIG. 6, the effect to reduce thermal expansion of the copper (Cu) in the lower layer is the greatest in the structure shown in FIG. 5B, and is the second greatest in the structure shown in FIG. 5A. Further, the effect to reduce thermal expansion of the copper (Cu) in the lower layer is the smallest in the structure shown in FIG. 5C.

From these comparison results, the diameter of the via 112 is made smaller in the surface on the opposite side from the bonding surface than in the bonding surface in the second layer 100-2, so that the region of the diffusion preventing film 102 can be made wider (can protrude more greatly) with respect to the metallic film 105-1. As such a structure shown in FIG. 5B is adopted, the effects of the present technology can be further enhanced.

Note that, in the first substrate 11 and the second substrate 21 that are bonded to each other in the solid-state imaging device 1 of the first embodiment, the region corresponding to the above described bonding portion shown in FIG. 3 is a particular peripheral region of the region surrounding the pixel region 13 in the first substrate 11, for example. That is, FIG. 3 shows the bonding portion between the peripheral region of the pixel region 13 in the first substrate 11 and the region corresponding to the peripheral region in the second substrate 21, for example.

Further, as a process according to a method for manufacturing the solid-state imaging device 1 of the first embodiment, the process illustrated in FIGS. 7A, 7B, 7C, 7D, 8A, 8B, and 8C is performed on at least one substrate between the first substrate 11 and the second substrate 21, for example. Note that, although not shown in the drawings, the diffusion preventing layer 100-3 and the second layer 100-2 are stacked on the first layer 100-1 prior to the process illustrated in FIGS. 7A, 7B, 7C, 7D, 8A, 8B, and 8C in this manufacturing process.

That is, after the metal seed film 104-1 is formed in the via 111 formed in the interlayer insulating film 101, the metallic film 105-1 made of copper (Cu) is buried in the via 111, to form the first layer 100-1. Further, the diffusion preventing film 102 and the interlayer insulating film 103 are stacked on the first layer 100-1 (FIG. 7A).

Figure 7:
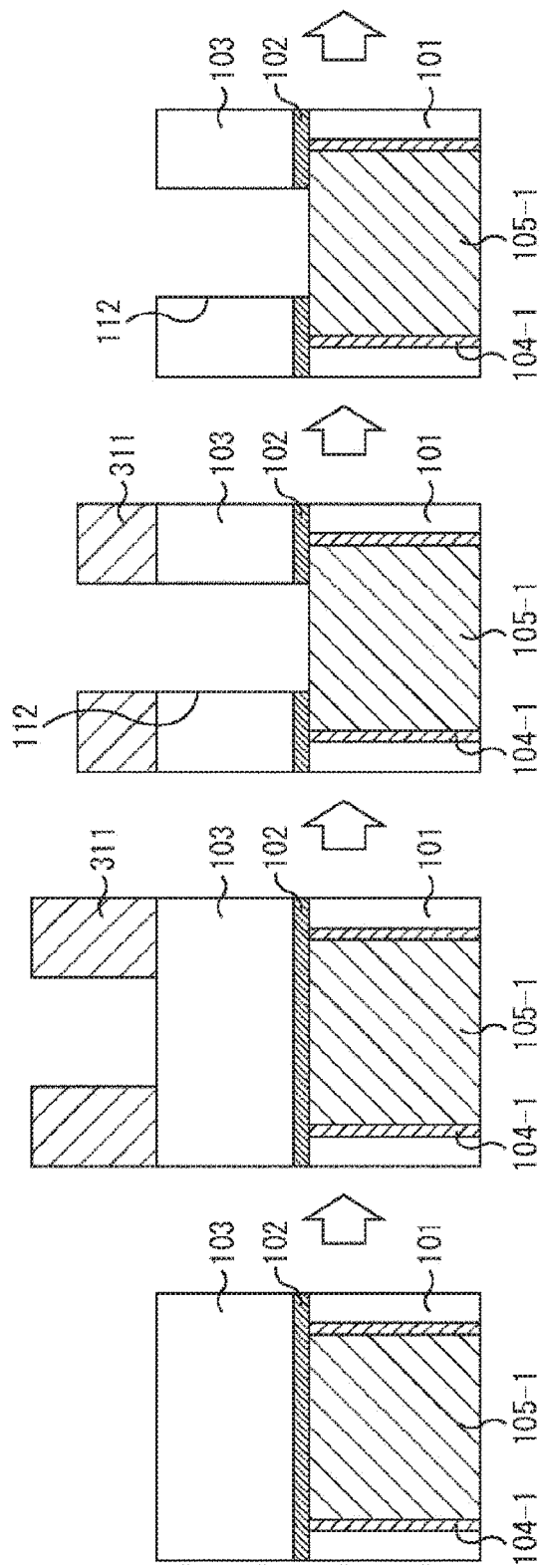
FIGS. 7A, 7B, 7C, and 7D are diagrams showing the flow of a manufacturing process.

After that, as shown in FIG. 7B, a photolithography process is performed, and a photoresist 311 is applied onto the interlayer insulating film 103, to generate a resist pattern for forming the via 112 (patterning). As shown in FIG. 7C, an etching process is then performed, and dry etching is performed, with the mask being the resist pattern generated in the photolithography process. As a result, the via 112 is formed in the diffusion preventing film 102 and the interlayer insulating film 103.

Figure 8:
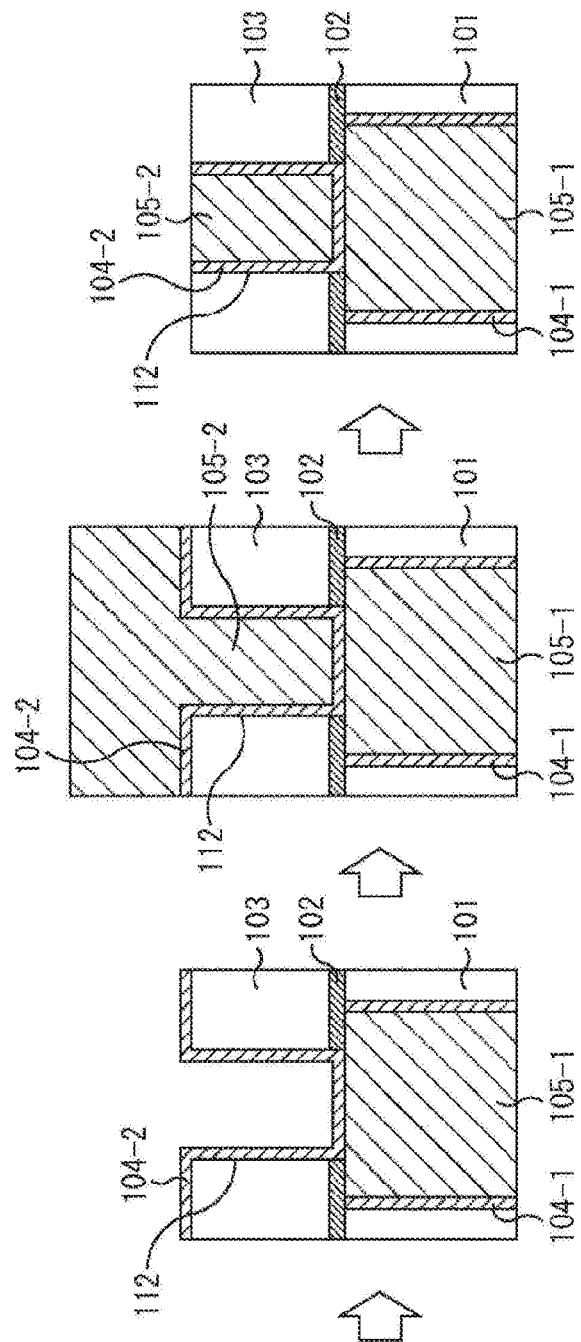
FIGS. 8A, 8B, and 8C are diagrams showing the flow of a manufacturing process.

Next, as shown in FIG. 7D, an ashing/cleaning process is performed, so that the resist film of the photoresist 311 is removed, and wet cleaning is performed. As shown in FIG. 8A, a first metallic film forming process is then performed, so that the metal seed film 104-2 is formed on the upper layer of the interlayer insulating film 103 and in the via 112 by sputtering.

Next, as shown in FIG. 8B, a second metallic film forming process is performed, so that a Cu seed layer is formed by sputtering, and the metallic film 105-2 made of copper (Cu) is further buried in the via 112 by Cu plating. Then, as shown in FIG. 8C, a polishing/planarizing process is then performed, so that the excess portion of the metallic film 105-2 and the metal seed film 104-2 on the interlayer insulating film 103 are removed by CMP (Chemical Mechanical Planarization).

As the above process is performed, the structure of the first substrate 11 or the second substrate 21 shown in FIG. 3 and the like can be formed.

3. Second Embodiment (Structure of the Bonding Portion)

Figure 9:
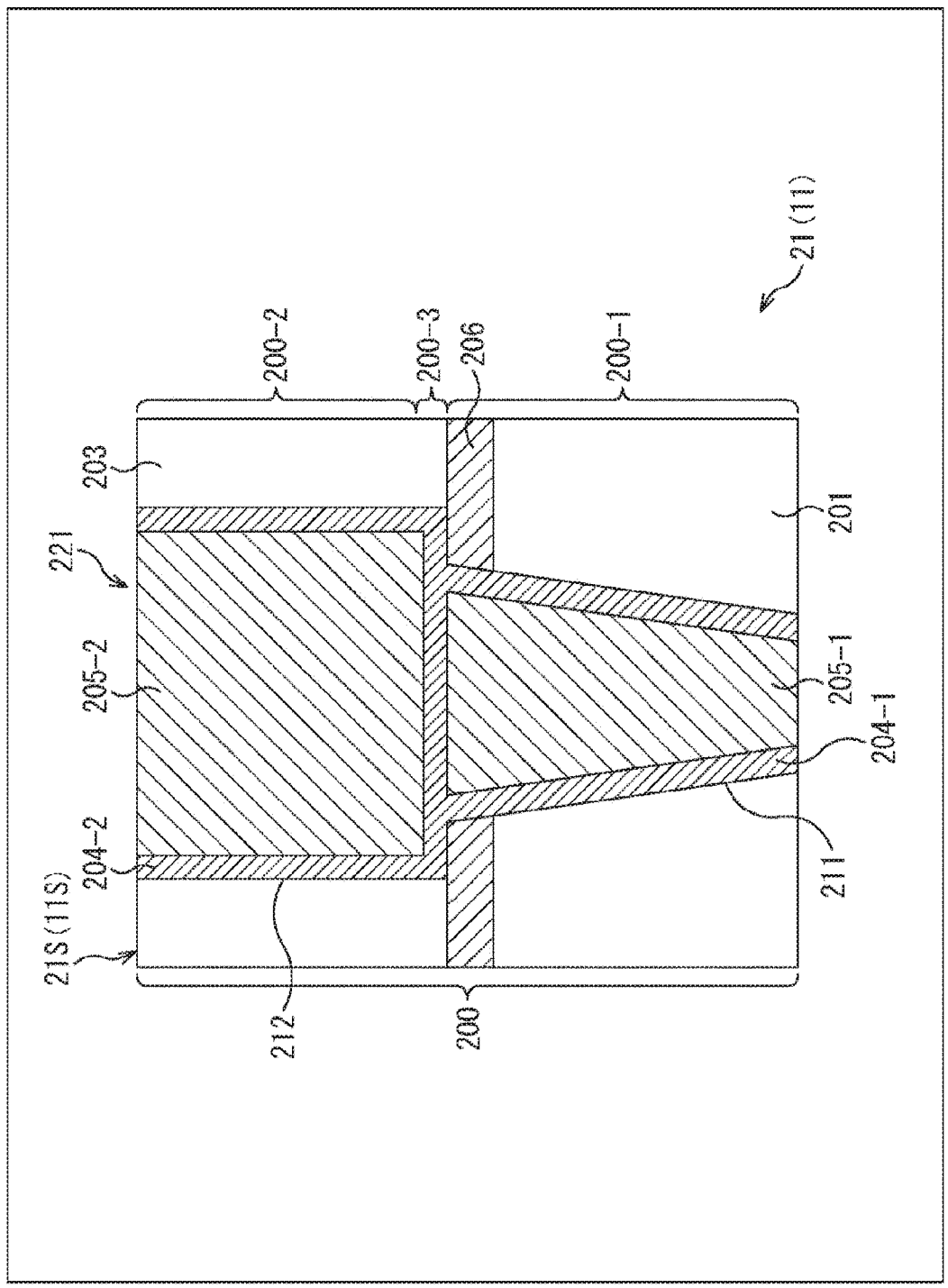

FIG. 9 is a cross-sectional view of relevant parts, showing the structure of a solid-state imaging device according to a second embodiment. In the description below, the configuration of a solid-state imaging device 1 according to the second embodiment is specifically described, with reference to the cross-sectional view of the relevant parts.

Note that, of a first substrate 11 and a second substrate 21 bonded in the solid-state imaging device 1, the second substrate 21 will be described as a typical example with reference to FIG. 9, but the first substrate 11 may have a similar structure (the structure of the second embodiment).

In FIG. 9, a laminated film 200 in which a first layer 200-1 and a second layer 200-2 are stacked is formed in the second substrate 21.

In the first layer 200-1, a via 211 is formed in an interlayer insulating film 201 made of silicon oxide ($SiO_2$) or the like, and a metallic film 205-1 made of copper (Cu) is buried therein. Note that, in the first layer 200-1, a hard mask 206 is formed on the interlayer insulating film 201.

Further, a metal seed film 204-1 as a barrier metal is formed between the side surface of the via 211 and the metallic film 205-1. The metal seed film 204-1 may be a film formed with tantalum (Ta), titanium (Ti), or the like, for example.

On the other hand, in the second layer 200-2, a via 212 is formed in an interlayer insulating film 203 made of silicon oxide ($SiO_2$) or the like, and a metallic film 205-2 made of copper (Cu) is buried therein. In the second layer 200-2, the metallic film 205-2 is buried in the via 212, so that a pad portion 221 made of copper (Cu) is formed on the side of the bonding surface 21S.

In the second layer 200-2, a metal seed film 204-2 is also formed between the side surface of the via 212 and the metallic film 205-2. The metal seed film 204-2 may be a film using tantalum (Ta), tantalum nitride (TaN), titanium (Ti), titanium nitride (TiN), tungsten (W), tungsten nitride (WN), a cobalt (Co)-containing alloy, manganese oxide (MnO), molybdenum (Mo), ruthenium (Ru), or the like, for example.

Here, in the laminated film 200, a diffusion preventing layer 200-3 is formed between the first layer 200-1 and the second layer 200-2. The diffusion preventing layer 200-3 includes part of the metal seed film 204-2.

That is, the metal seed film 204-2 is formed not only between the side surface of the via 212 and the metallic film 205-2, but also in the region under the metallic film 205-2. Accordingly, the metal seed film 204-2 is also formed between the metallic film 205-2 buried in the via 212 of the second layer 200-2 and the metallic film 205-1 buried in the via 211 of the first layer 200-1, and forms the diffusion preventing layer 100-3.

As described above, in the second substrate 21, the diffusion preventing layer 200-3 including part of the metal seed film 204-2 is formed between the first layer 200-1 and the second layer 200-2, and functions as a "support" that reduces volume expansion of the copper (Cu) serving as the metallic film 205-1 buried in the via 211 of the first layer 200-1 as the lower layer. Thus, it is also possible to reduce thermal expansion of the metallic film 205-1 made of copper (Cu) during the heat treatment after bonding the bonding surfaces (11S and 21S) of the first substrate 11 and the second substrate 21.

Note that, although a solid-state imaging device to which the present technology is applied has been described above as an example, the present technology can be applied not only to a solid-state imaging device but also to any semiconductor device in which substrates are bonded and stacked.

4. Specific Example Configurations of Solid-State Imaging Devices

Figure 10:
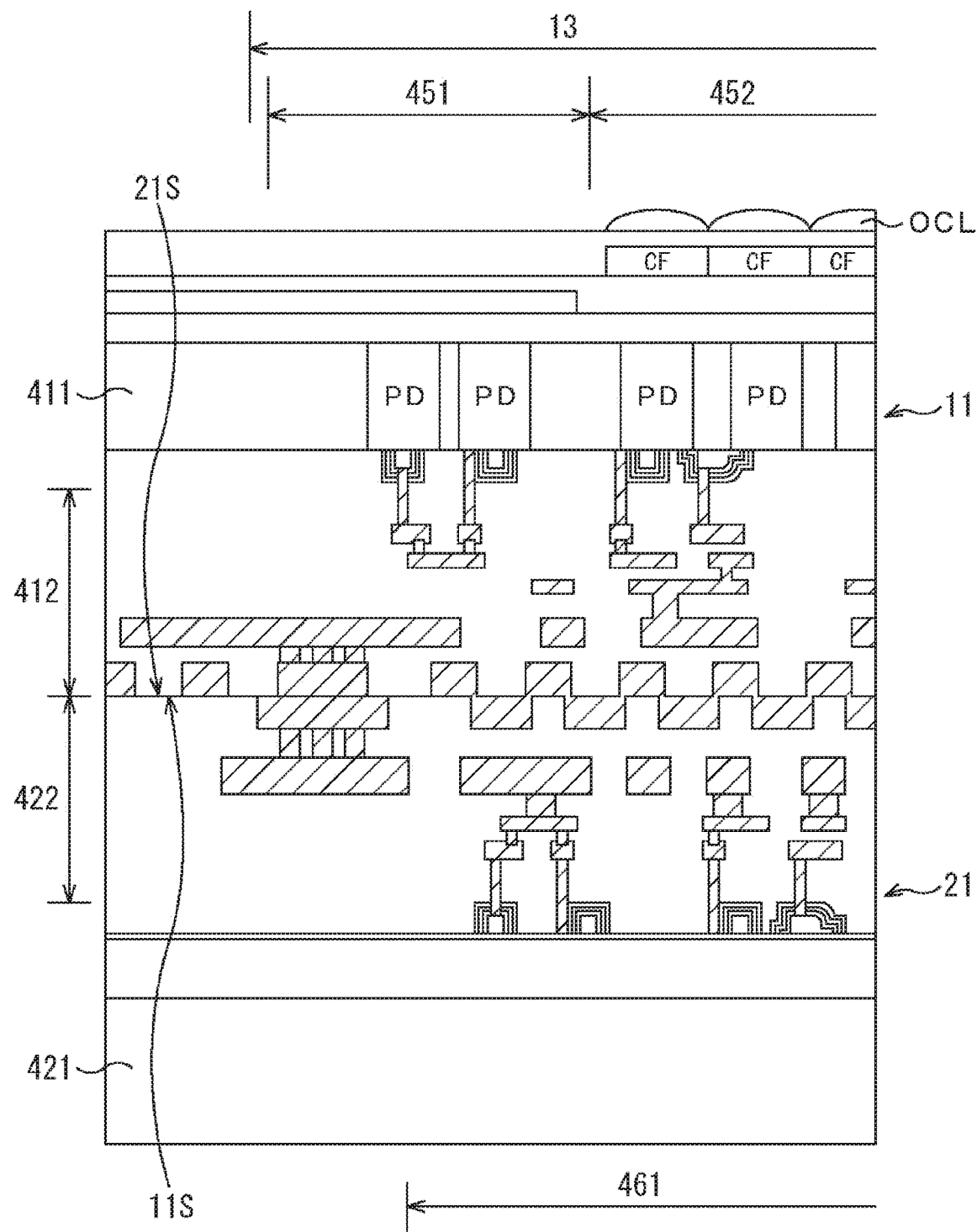

FIG. 10 is a cross-sectional view of relevant parts, showing a first specific example of the structure of a solid-state imaging device to which the present technology is applied.

In FIG. 10, the first substrate 11 includes a semiconductor layer 411 made of silicon turned into a thin film. The pixel region 13 in which a plurality of pixels formed with photodiodes (PDs) to serve as photoelectric conversion units and a plurality of pixel transistors are two-dimensionally arranged in a regular manner is formed in the semiconductor layer 411.

In the first substrate 11, a wiring layer 412 is formed on the front surface side of the semiconductor layer 411, and a light blocking film is formed on the back surface side of the semiconductor layer 411 including the upper portion of an optical black region 451. Color filters (CFs) and on-chip lenses (OCLs) are further formed an effective pixel region 452.

Also, in FIG. 10, a logic circuit 461 forming a peripheral circuit is formed in a predetermined region of a semiconductor layer 421 made of silicon in the second substrate 21. In the second substrate 21, a wiring layer 422 is formed on the front surface side of the semiconductor layer 421.

In the first substrate 11 and the second substrate 21 having the above described structure, the bonding surface 11S of the first substrate 11 and the bonding surface 21S of the second substrate 21 are bonded to each other, and (the structure of a portion in the vicinity of the bonding surface of) at least one layer of the wiring layer 412 of the first substrate 11 and the wiring layer 422 of the second substrate 21 has the structure corresponding to the laminated film 100 shown in FIG. 3 (including the diffusion preventing layer 100-3).

With this arrangement, thermal expansion of the metallic film (copper (Cu)) during the heat treatment after the bonding of the bonding surfaces (11S and 21S) of the first substrate 11 and the second substrate 21 can be reduced. As a result, it becomes possible to prevent a copper (Cu) pumping phenomenon (Cu pumping) from occurring in the bonding surface 11S of the bonding surface 21S.

Figure 11:
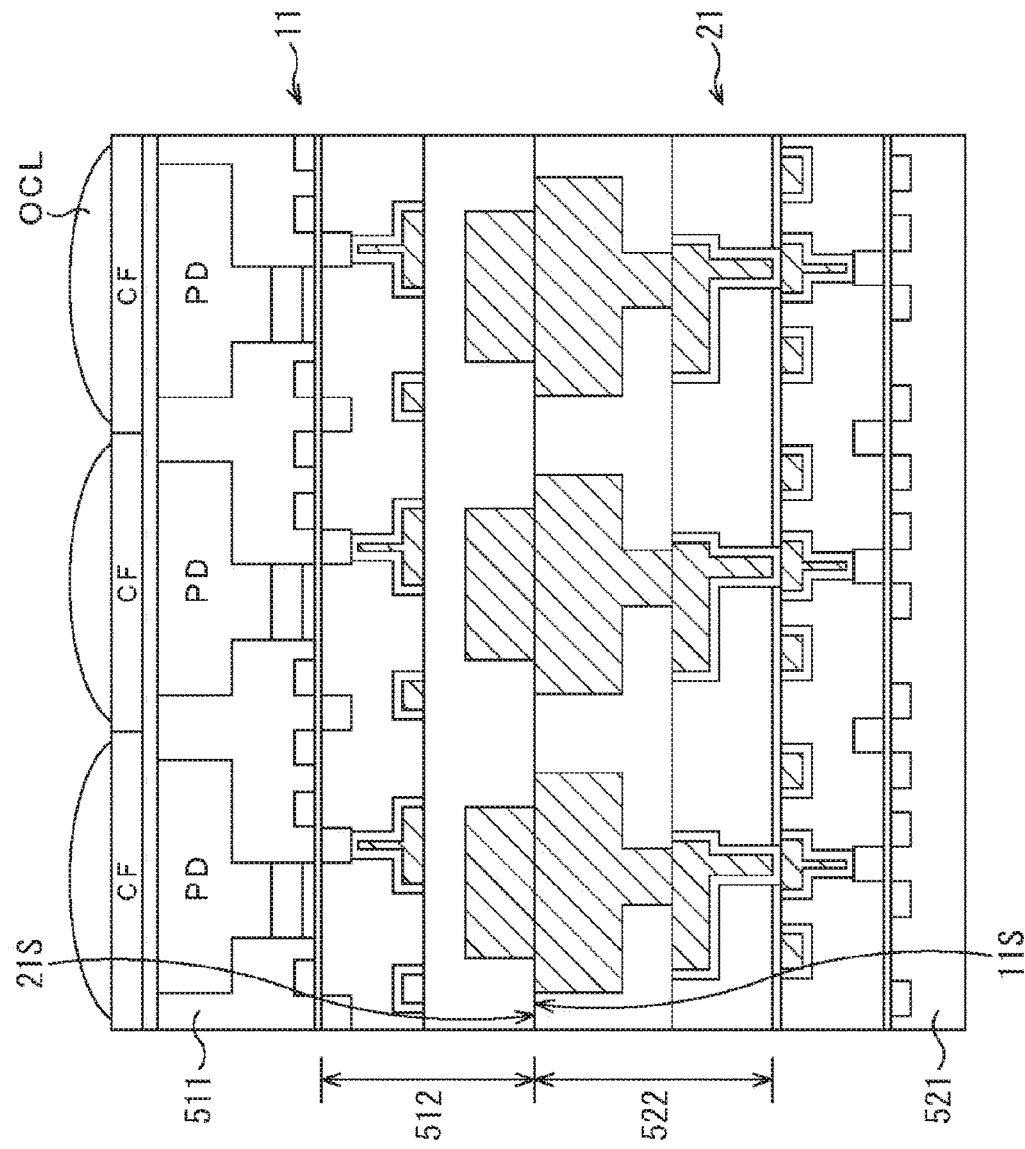

FIG. 11 is a cross-sectional view of relevant parts, showing a second specific example of the structure of a solid-state imaging device to which the present technology is applied.

In FIG. 11, the first substrate 11 includes a semiconductor layer 511, and a pixel region in which a plurality of pixels formed with photodiodes (PDs) and a plurality of pixel transistors are two-dimensionally arranged in a regular manner is formed in the semiconductor layer 511. In the first substrate 11, a wiring layer 512 is formed on the front surface side of the semiconductor layer 511, and color filters (CFs) and on-chip lenses (OCLs) are formed above the respective photodiodes (PDs) on the back surface side of the semiconductor layer 511.

Also, in FIG. 11, a peripheral circuit is formed in a predetermined region of a semiconductor layer 521 in the second substrate 21. In the second substrate 21, a wiring layer 522 is formed on the front surface side of the semiconductor layer 521.

In the first substrate 11 and the second substrate 21 having the above described structure, the bonding surface 11S and the bonding surface 21S are bonded to each other, and (the structure of a portion in the vicinity of the bonding surface of) at least one layer of the wiring layer 512 of the first substrate 11 and the wiring layer 522 of the second substrate 21 has the structure corresponding to the laminated film 100 shown in FIG. 3 (including the diffusion preventing layer 100-3). Thus, it is possible to prevent a copper (Cu) pumping phenomenon (Cu pumping) from occurring in the bonding surface 11S or the bonding surface 21S during the heat treatment.

5. Example Configuration of an Electronic Apparatus

The above described solid-state imaging device 1 as a semiconductor device can be applied to a camera system such as a digital camera or a video camera, for example, and can be further applied to an electronic apparatus such as a portable telephone having an imaging function or some other device having an imaging function.

Figure 12:
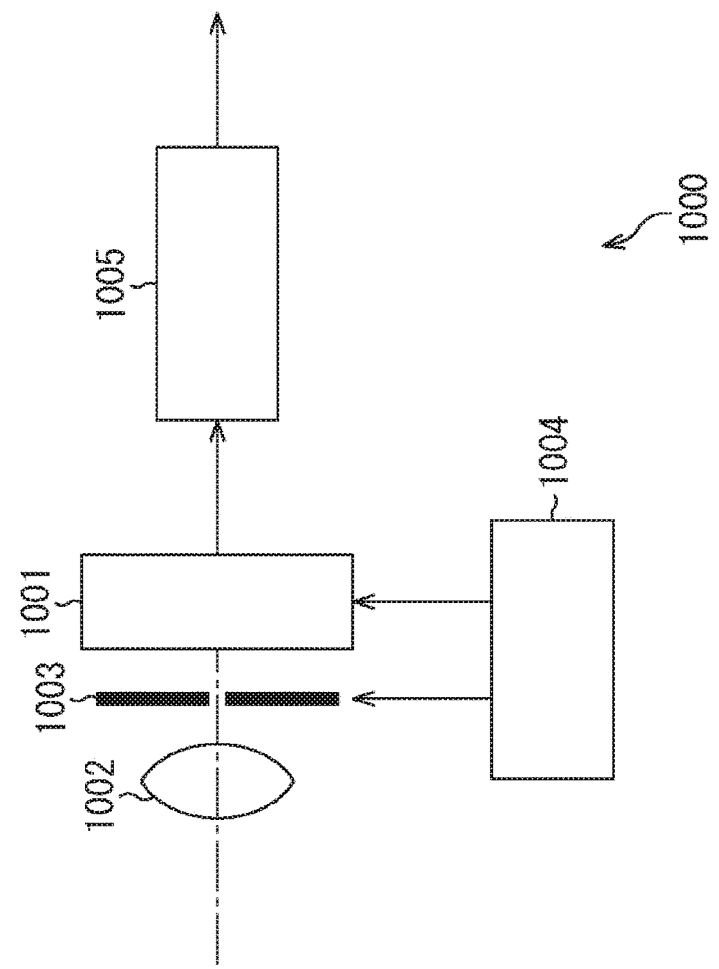

FIG. 12 is a diagram showing an example configuration of an electronic apparatus using a solid-state imaging device to which the present technology is applied. FIG. 12 shows, as an example of such an electronic apparatus, an example configuration of an imaging apparatus 1000 as a video camera capable of capturing a still image or a moving image.

In FIG. 12, the imaging apparatus 1000 includes: a solid-state imaging device 1001; an optical system 1002 that guides incident light to a light receiving sensor unit of the solid-state imaging device 1001; a shutter device 1003; a drive circuit 1004 that drives the solid-state imaging device 1001; and a signal processing circuit 1005 that processes an output signal of the solid-state imaging device 1001.

The above described solid-state imaging device 1 (FIG. 1) is used as the solid-state imaging device 1001. The optical system (an optical lens) 1002 gathers image light (incident light) from an object, and forms an image on the imaging surface of the solid-state imaging device 1001. With this, signal charges are stored in the solid-state imaging device 1001 for a certain period of time. Such an optical system 1002 may be an optical lens system including a plurality of optical lenses.

The shutter device 1003 controls the light exposure period and the light blocking period for the solid-state imaging device 1001. The drive circuit 1004 supplies a drive signal to the solid-state imaging device 1001 and the shutter device 1003. With the supplied drive signal (a timing signal), the drive circuit 1004 controls an operation to be performed by the solid-state imaging device 1001 to output a signal to the signal processing circuit 1005, and controls a shutter operation of the shutter device 1003. That is, by supplying the drive signal (timing signal), the drive circuit 1004 performs an operation to be performed by the solid-state imaging device 1001 to transfer a signal to the signal processing circuit 1005.

The signal processing circuit 1005 performs various kinds of signal processing on signals transferred from the solid-state imaging device 1001. A video signal obtained by this signal processing is stored into a storage medium such as a memory in a later stage, or is output to a monitor, for example.

In the electronic apparatus using a solid-state imaging device to which the present technology described above is applied, the solid-state imaging device 1 capable of reducing electrode bonding defects when two substrates are stacked and bonded to each other can be used as the solid-state imaging device 1001.

6. Examples of Use of a Solid-State Imaging Device

Figure 13:
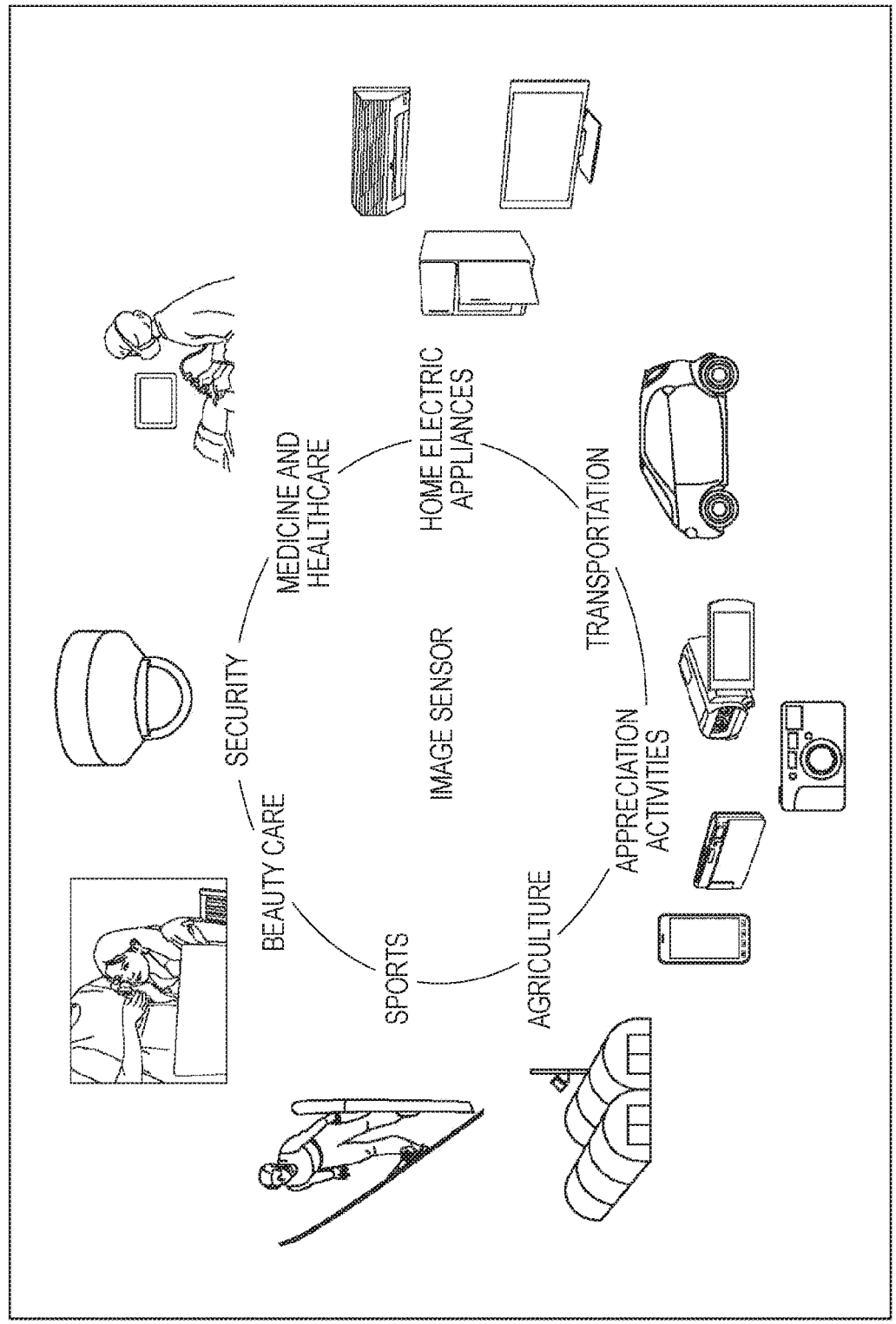

FIG. 13 is a diagram showing examples of use of a solid-state imaging device to which the present technology is applied.

The solid-state imaging device 1 can be used in various cases where light such as visible light, infrared light, ultraviolet light, or an X-ray is sensed, as described below, for example. That is, as shown in FIG. 13, the solid-state imaging device 1 can be employed in an apparatus that is used not only in the appreciation activity field where images are taken and are used in appreciation activities, but also in the field of transportation, the field of home electric appliances, the fields of medicine and healthcare, the field of security, the field of beauty care, the field of sports, or the field of agriculture, for example.

Specifically, in the appreciation activity field, the solid-state imaging device 1 can be used in an apparatus (the imaging apparatus 1000 in FIG. 12, for example) for capturing images to be used in appreciation activities, such as a digital camera, a smartphone, or a portable telephone with a camera function, as described above.

In the field of transportation, the solid-state imaging device 1 can be used in apparatuses for transportation use, such as vehicle-mounted sensors configured to capture images of the front, the back, the surroundings, the inside of an automobile, and the like to perform safe driving such as an automatic stop and recognize a driver's condition or the like, surveillance cameras for monitoring running vehicles and roads, and ranging sensors or the like for measuring distances between vehicles, for example.

In the field of home electric appliances, the solid-state imaging device 1 can be used in an apparatus to be used as home electric appliances, such as a television set, a refrigerator, or an air conditioner, to capture images of gestures of users and operate the apparatus in accordance with the gestures, for example. Also, in the fields of medicine and healthcare, the solid-state imaging device 1 can be used in an apparatus for medical use or healthcare use, such as an endoscope or an apparatus for receiving infrared light for angiography, for example.

In the field of security, the solid-state imaging device 1 can be used in apparatuses for security use, such as surveillance cameras for crime prevention and cameras for personal authentication, for example. Further, in the field of beauty care, the solid-state imaging device 1 can be used in an apparatus for beauty care use, such as a skin measurement apparatus configured to image the skin or a microscope for imaging the scalp, for example.

In the field of sports, the solid-state imaging device 1 can be used in apparatuses for sporting use, such as action cameras and wearable cameras for sports, for example. Further, in the field of agriculture, the solid-state imaging device 1 can be used in apparatuses for agricultural use, such as cameras for monitoring conditions of fields and crops, for example.

7. Example Application to an In-Vivo Information Acquisition System

The technology (the present technology) according to the present disclosure can be applied to various products. For example, the technology according to the present disclosure may be applied to an endoscopic surgery system.

Figure 14:
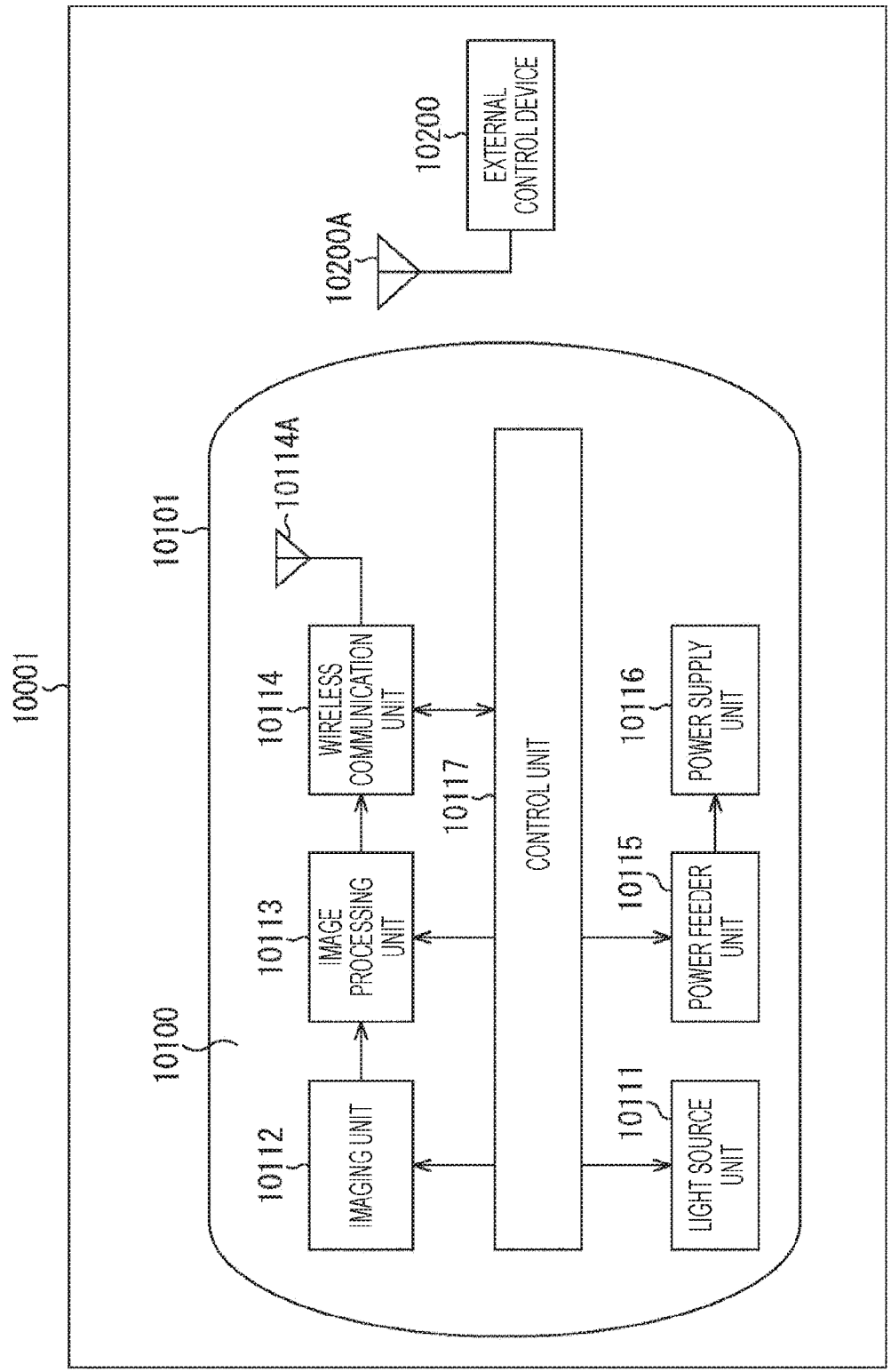

FIG. 14 is a block diagram schematically showing an example configuration of a patient's in-vivo information acquisition system using a capsule endoscope to which the technology (the present technology) according to the present disclosure may be applied.

An in-vivo information acquisition system 10001 includes a capsule endoscope 10100 and an external control device 10200.

The capsule endoscope 10100 is swallowed by the patient at the time of examination. The capsule endoscope 10100 has an imaging function and a wireless communication function. Before naturally discharged from the patient, the capsule endoscope 10100 moves inside the internal organs such as the stomach and the intestines by peristaltic motion or the like, sequentially captures images of the inside of the internal organs (these images will be hereinafter also referred to as in-vivo images) at predetermined intervals, and sequentially transmits information about the in-vivo images to the external control device 10200 outside the body in a wireless manner.

Further, the external control device 10200 controls the overall operation of the in-vivo information acquisition system 10001. The external control device 10200 also receives the information about the in-vivo images transmitted from the capsule endoscope 10100, and, on the basis of the received in-vivo image information, generates image data for displaying the in-vivo images on a display device (not shown).

In this manner, the in-vivo information acquisition system 10001 can acquire in-vivo images showing the states of the inside of the body of the patient at any appropriate time until the swallowed capsule endoscope 10100 is discharged.

The configurations and the functions of the capsule endoscope 10100 and the external control device 10200 are now described in greater detail.

The capsule endoscope 10100 has a capsule-like housing 10101, and the housing 10101 houses a light source unit 10111, an imaging unit 10112, an image processing unit 10113, a wireless communication unit 10114, a power feeder unit 10115, a power supply unit 10116, and a control unit 10117.

The light source unit 10111 is formed with a light source such as a light emitting diode (LED), for example, and emits light onto the imaging field of view of the imaging unit 10112.

The imaging unit 10112 is formed with an imaging device and an optical system including a plurality of lenses provided in front of the imaging device. Reflected light of light emitted to body tissue as the current observation target (this reflected light will be hereinafter referred to as the observation light) is collected by the optical system, and enters the imaging device. In the imaging unit 10112, the observation light incident on the imaging device is photoelectrically converted, and an image signal corresponding to the observation light is generated. The image signal generated by the imaging unit 10112 is supplied to the image processing unit 10113.

The image processing unit 10113 is formed with a processor such as a central processing unit (CPU) or a graphics processing unit (GPU), and performs various kinds of signal processing on the image signal generated by the imaging unit 10112. The image processing unit 10113 supplies the image signal subjected to the signal processing as RAW data to the wireless communication unit 10114.

Further, the wireless communication unit 10114 performs predetermined processing such as modulation processing on the image signal subjected to the signal processing by the image processing unit 10113, and transmits the image signal to the external control device 10200 via an antenna 10114A. The wireless communication unit 10114 also receives a control signal related to control of driving of the capsule endoscope 10100 from the external control device 10200 via the antenna 10114A. The wireless communication unit 10114 supplies the control signal received from the external control device 10200 to the control unit 10117.

The power feeder unit 10115 includes an antenna coil for power reception, a power regeneration circuit that regenerates electric power from the current generated in the antenna coil, a booster circuit, and the like. In the power feeder unit 10115, electric power is generated according to a so-called non-contact charging principle.

The power supply unit 10116 is formed with a secondary battery, and stores the electric power generated by the power feeder unit 10115. In FIG. 14, to avoid complication of the drawing, an arrow or the like indicating the destination of power supply from the power supply unit 10116 is not shown. However, the electric power stored in the power supply unit 10116 is supplied to the light source unit 10111, the imaging unit 10112, the image processing unit 10113, the wireless communication unit 10114, and the control unit 10117, and can be used for driving these units.

The control unit 10117 is formed with a processor such as a CPU, and drives the light source unit 10111, the imaging unit 10112, the image processing unit 10113, the wireless communication unit 10114, and the power feeder unit 10115 unit as appropriate in accordance with a control signal transmitted from the external control device 10200.

The external control device 10200 is formed with a processor such as a CPU or a GPU, or a microcomputer, a control board, or the like on which a processor and a storage element such as a memory are mounted together. The external control device 10200 controls operation of the capsule endoscope 10100 by transmitting a control signal to the control unit 10117 of the capsule endoscope 10100 via an antenna 10200A. In the capsule endoscope 10100, the conditions for emitting light to the current observation target in the light source unit 10111 can be changed in accordance with the control signal from the external control device 10200, for example. Further, the imaging conditions (such as the frame rate and the exposure value in the imaging unit 10112, for example) can also be changed in accordance with the control signal from the external control device 10200. Further, the contents of the processing in the image processing unit 10113 and the conditions (such as the transmission intervals and the number of images to be transmitted, for example) for the wireless communication unit 10114 to transmit image signals may be changed in accordance with the control signal from the external control device 10200.

Further, the external control device 10200 also performs various kinds of image processing on the image signal transmitted from the capsule endoscope 10100, and generates image data for displaying a captured in-vivo image on the display device. Examples of the image processing include various kinds of signal processing, such as a development process (a demosaicing process), an image quality enhancement process (a band emphasizing process, a super-resolution process, a noise reduction (NR) process, a camera shake correction process, and/or the like), and/or an enlargement process (an electronic zooming process), for example. The external control device 10200 controls driving of the display device, to cause the display device to display an in-vivo image captured on the basis of the generated image data. Alternatively, the external control device 10200 may cause a recording device (not shown) to record the generated image data, or cause a printing device (not shown) to print out the generated image data.

An example of an in-vivo information acquisition system to which the technology according to the present disclosure can be applied has been described above. The technology according to the present disclosure can be applied to the imaging unit 10112 in the above described configuration. Specifically, the solid-state imaging device 1 in FIG. 1 can be applied to the imaging unit 10112. With this solid-state imaging device 1, it is possible to reduce defects in electrode bonding when stacking and bonding two substrates.

8. Example Application to an Endoscopic Surgery System

The technology (the present technology) according to the present disclosure can be applied to various products. For example, the technology according to the present disclosure may be applied to an endoscopic surgery system.

Figure 15:
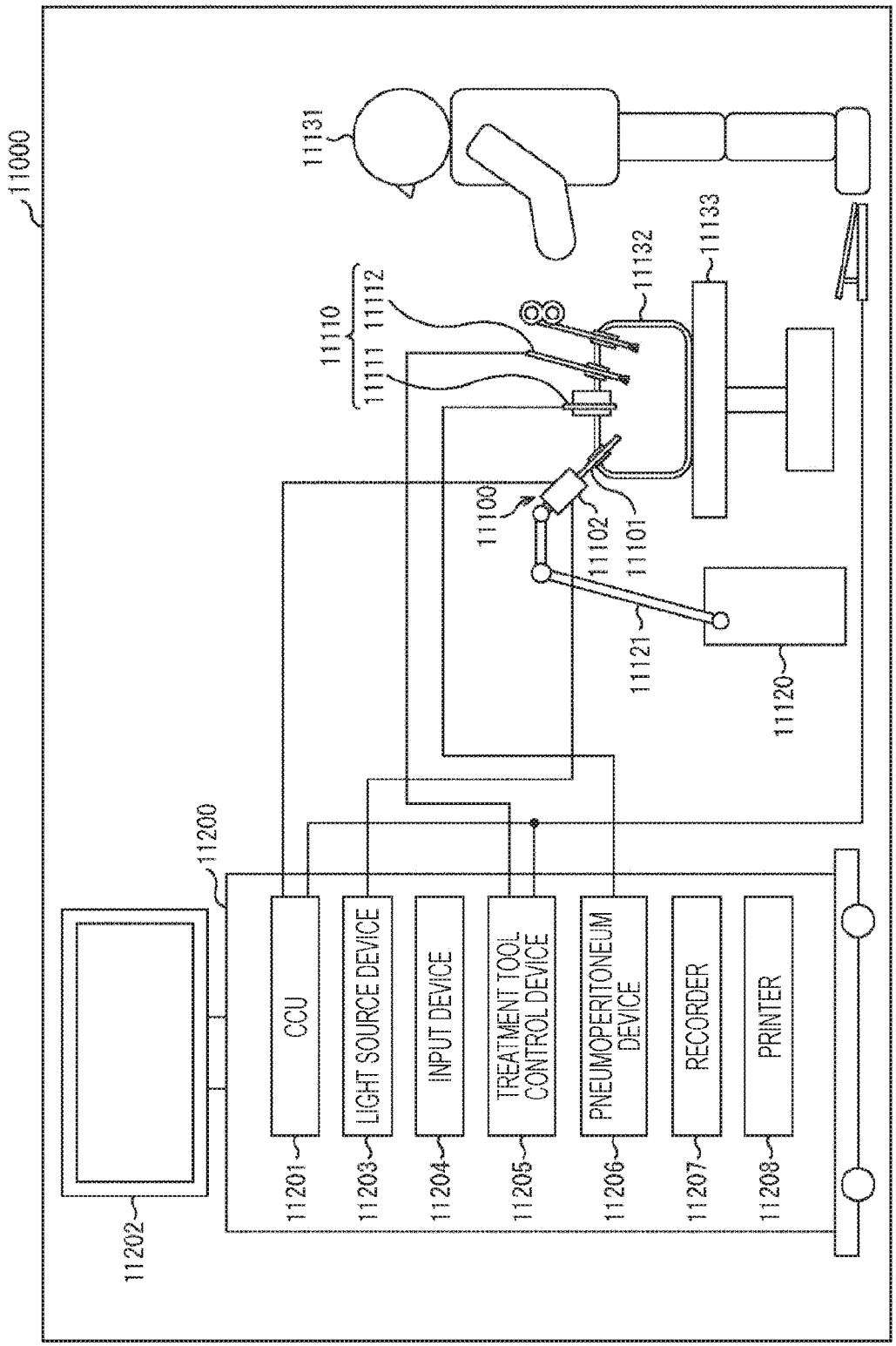

FIG. 15 is a diagram schematically showing an example configuration of an endoscopic surgery system to which the technology (the present technology) according to the present disclosure may be applied.

FIG. 15 shows a situation where a surgeon (a physician) 11131 is performing surgery on a patient 11132 on a patient bed 11133, using an endoscopic surgery system 11000. As shown in the drawing, the endoscopic surgery system 11000 includes an endoscope 11100, other surgical tools 11110 such as a pneumoperitoneum tube 11111 and an energy treatment tool 11112, a support arm device 11120 that supports the endoscope 11100, and a cart 11200 on which various kinds of devices for endoscopic surgery are mounted.

The endoscope 11100 includes a lens barrel 11101 that has a region of a predetermined length from the top end to be inserted into a body cavity of the patient 11132, and a camera head 11102 connected to the base end of the lens barrel 11101. In the example shown in the drawing, the endoscope 11100 is configured as a so-called rigid scope having a rigid lens barrel 11101. However, the endoscope 11100 may be configured as a so-called flexible scope having a flexible lens barrel.

At the top end of the lens barrel 11101, an opening into which an objective lens is inserted is provided. A light source device 11203 is connected to the endoscope 11100, and the light generated by the light source device 11203 is guided to the top end of the lens barrel by a light guide extending inside the lens barrel 11101, and is emitted toward the current observation target in the body cavity of the patient 11132 via the objective lens. Note that the endoscope 11100 may be a forward-viewing endoscope, an oblique-viewing endoscope, or a side-viewing endoscope.

An optical system and an imaging device are provided inside the camera head 11102, and reflected light (observation light) from the current observation target is converged on the imaging device by the optical system. The observation light is photoelectrically converted by the imaging device, and an electrical signal corresponding to the observation light, or an image signal corresponding to the observation image, is generated. The image signal is transmitted as RAW data to a camera control unit (CCU) 11201.

The CCU 11201 is formed with a central processing unit (CPU), a graphics processing unit (GPU), or the like, and collectively controls operations of the endoscope 11100 and a display device 11202. Further, the CCU 11201 receives an image signal from the camera head 11102, and subjects the image signal to various kinds of image processing, such as a development process (demosaicing process), for example, to display an image based on the image signal.

Under the control of the CCU 11201, the display device 11202 displays an image based on the image signal subjected to the image processing by the CCU 11201.

The light source device 11203 is formed with a light source such as a light emitting diode (LED), for example, and supplies the endoscope 11100 with illuminating light for imaging the surgical site or the like.

An input device 11204 is an input interface to the endoscopic surgery system 11000. The user can input various kinds of information and instructions to the endoscopic surgery system 11000 via the input device 11204. For example, the user inputs an instruction or the like to change imaging conditions (such as the type of illuminating light, the magnification, and the focal length) for the endoscope 11100.

A treatment tool control device 11205 controls driving of the energy treatment tool 11112 for tissue cauterization, incision, blood vessel sealing, or the like. A pneumoperitoneum device 11206 injects a gas into a body cavity of the patient 11132 via the pneumoperitoneum tube 11111 to inflate the body cavity, for the purpose of securing the field of view of the endoscope 11100 and the working space of the surgeon. A recorder 11207 is a device capable of recording various kinds of information about the surgery. A printer 11208 is a device capable of printing various kinds of information relating to the surgery in various formats such as text, images, graphics, and the like.

Note that the light source device 11203 that supplies the endoscope 11100 with the illuminating light for imaging the surgical site can be formed with an LED, a laser light source, or a white light source that is a combination of an LED and a laser light source, for example. In a case where a white light source is formed with a combination of RGB laser light sources, the output intensity and the output timing of each color (each wavelength) can be controlled with high precision. Accordingly, the white balance of an image captured by the light source device 11203 can be adjusted. Alternatively, in this case, laser light from each of the RGB laser light sources may be emitted onto the current observation target in a time-division manner, and driving of the imaging device of the camera head 11102 may be controlled in synchronization with the timing of the light emission. Thus, images corresponding to the respective RGB colors can be captured in a time-division manner. According to the method, a color image can be obtained without any color filter provided in the imaging device.

Further, the driving of the light source device 11203 may also be controlled so that the intensity of light to be output is changed at predetermined time intervals. The driving of the imaging device of the camera head 11102 is controlled in synchronism with the timing of the change in the intensity of the light, and images are acquired in a time-division manner and are then combined. Thus, a high dynamic range image with no black portions and no white spots can be generated.

Further, the light source device 11203 may also be designed to be capable of supplying light of a predetermined wavelength band compatible with special light observation. In special light observation, light of a narrower band than the illuminating light (or white light) at the time of normal observation is emitted, with the wavelength dependence of light absorption in body tissue being taken advantage of, for example. As a result, so-called narrow band imaging is performed to image predetermined tissue such as a blood vessel in a mucosal surface layer or the like, with high contrast. Alternatively, in the special light observation, fluorescence observation for obtaining an image with fluorescence generated through emission of excitation light may be performed. In fluorescence observation, excitation light is emitted to body tissue so that the fluorescence from the body tissue can be observed (autofluorescence observation). Alternatively, a reagent such as indocyanine green (ICG) is locally injected into body tissue, and excitation light corresponding to the fluorescence wavelength of the reagent is emitted to the body tissue so that a fluorescent image can be obtained, for example. The light source device 11203 can be designed to be capable of suppling narrowband light and/or excitation light compatible with such special light observation.

Figure 16:
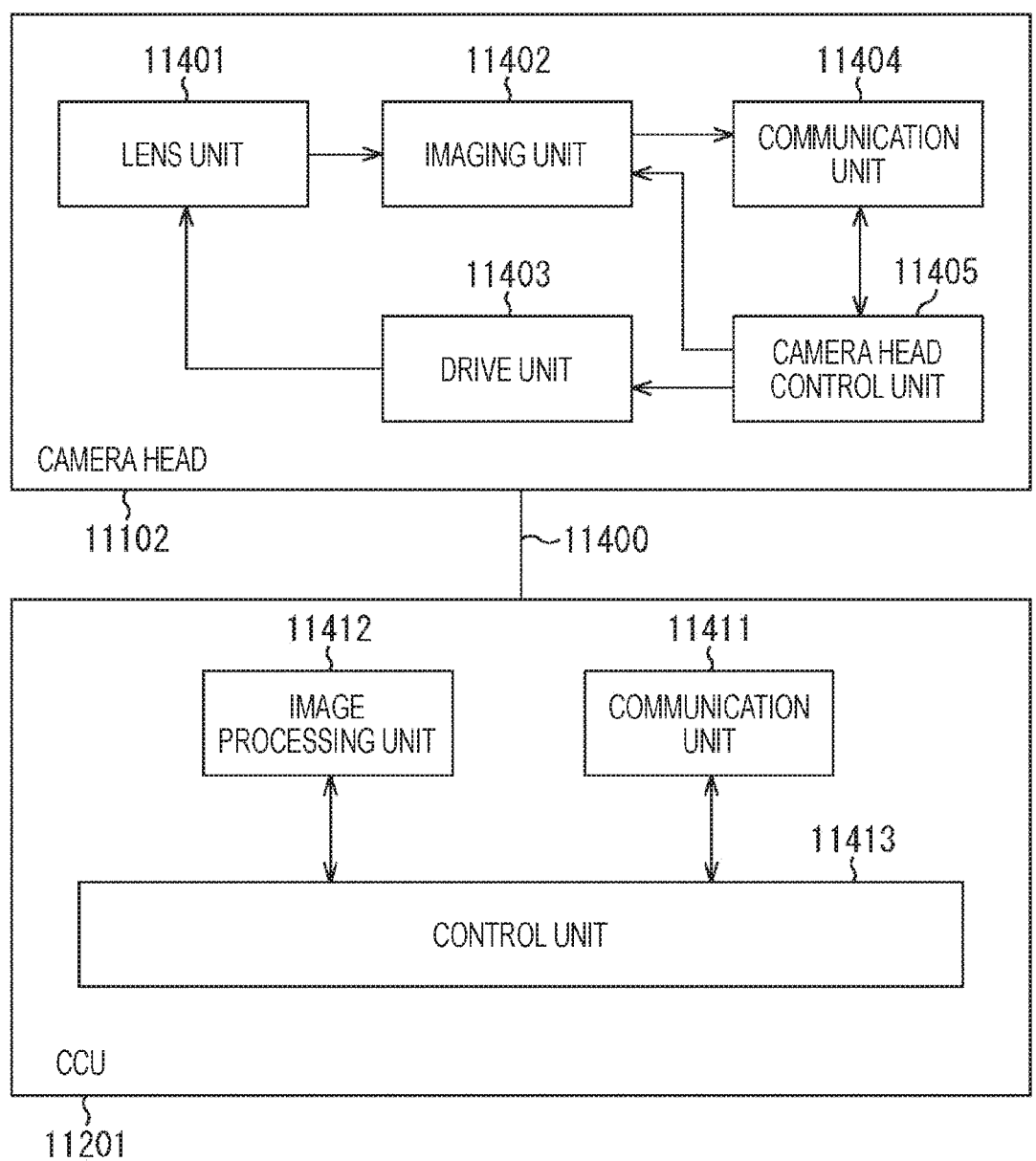

FIG. 16 is a block diagram showing an example of the functional configurations of the camera head 11102 and the CCU 11201 shown in FIG. 15.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at the connecting portion with the lens barrel 11101. Observation light captured from the top end of the lens barrel 11101 is guided to the camera head 11102, and enters the lens unit

11401. The lens unit 11401 is formed with a combination of a plurality of lenses including a zoom lens and a focus lens.

The imaging unit 11402 is formed with an imaging device. The imaging unit 11402 may be formed with one imaging device (a so-called single-plate type), or may be formed with a plurality of imaging devices (a so-called multiple-plate type). In a case where the imaging unit 11402 is of a multiple-plate type, for example, image signals corresponding to the respective RGB colors may be generated by the respective imaging devices, and be then combined to obtain a color image. Alternatively, the imaging unit 11402 may be designed to include a pair of imaging devices for acquiring right-eye and left-eye image signals compatible with three-dimensional (3D) display. As the 3D display is conducted, the surgeon 11131 can grasp more accurately the depth of the body tissue at the surgical site. Note that, in a case where the imaging unit 11402 is of a multiple-plate type, a plurality of lens units 11401 are provided for the respective imaging devices.

Further, the imaging unit 11402 is not necessarily provided in the camera head 11102. For example, the imaging unit 11402 may be provided immediately behind the objective lens in the lens barrel 11101.

The drive unit 11403 is formed with an actuator, and, under the control of the camera head control unit 11405, moves the zoom lens and the focus lens of the lens unit 11401 by a predetermined distance along the optical axis. With this arrangement, the magnification and the focal point of the image captured by the imaging unit 11402 can be appropriately adjusted.

The communication unit 11404 is formed with a communication device for transmitting and receiving various kinds of information to and from the CCU 11201. The communication unit 11404 transmits the image signal obtained as RAW data from the imaging unit 11402 to the CCU 11201 via the transmission cable 11400.

Further, the communication unit 11404 also receives a control signal for controlling the driving of the camera head 11102 from the CCU 11201, and supplies the control signal to the camera head control unit 11405. The control signal includes information about imaging conditions, such as information for specifying the frame rate of captured images, information for specifying the exposure value at the time of imaging, and/or information for specifying the magnification and the focal point of captured images, for example.

Note that the above imaging conditions such as the frame rate, the exposure value, the magnification, and the focal point may be appropriately specified by the user, or may be automatically set by the control unit 11413 of the CCU 11201 on the basis of an acquired image signal. In the latter case, the endoscope 11100 has a so-called auto-exposure (AE) function, an auto-focus (AF) function, and an auto-white-balance (AWB) function.

The camera head control unit 11405 controls the driving of the camera head 11102, on the basis of a control signal received from the CCU 11201 via the communication unit 11404.

The communication unit 11411 is formed with a communication device for transmitting and receiving various kinds of information to and from the camera head 11102. The communication unit 11411 receives an image signal transmitted from the camera head 11102 via the transmission cable 11400.

Further, the communication unit 11411 also transmits a control signal for controlling the driving of the camera head 11102, to the camera head 11102. The image signal and the control signal can be transmitted through electrical communication, optical communication, or the like.

The image processing unit 11412 performs various kinds of image processing on an image signal that is RAW data transmitted from the camera head 11102.

The control unit 11413 performs various kinds of control relating to display of an image of the surgical portion or the like captured by the endoscope 11100, and a captured image obtained through imaging of the surgical site or the like. For example, the control unit 11413 generates a control signal for controlling the driving of the camera head 11102.

Further, the control unit 11413 also causes the display device 11202 to display a captured image showing the surgical site or the like, on the basis of the image signal subjected to the image processing by the image processing unit 11412. In doing so, the control unit 11413 may recognize the respective objects shown in the captured image, using various image recognition techniques. For example, the control unit 11413 can detect the shape, the color, and the like of the edges of an object shown in the captured image, to recognize the surgical tool such as forceps, a specific body site, bleeding, the mist at the time of use of the energy treatment tool 11112, and the like. When causing the display device 11202 to display the captured image, the control unit 11413 may cause the display device 11202 to superimpose various kinds of surgery aid information on the image of the surgical site on the display, using the recognition result. As the surgery aid information is superimposed and displayed, and thus, is presented to the surgeon 11131, it becomes possible to reduce the burden on the surgeon 11131, and enable the surgeon 11131 to proceed with the surgery in a reliable manner.

The transmission cable 11400 connecting the camera head 11102 and the CCU 11201 is an electrical signal cable compatible with electric signal communication, an optical fiber compatible with optical communication, or a composite cable thereof.

Here, in the example shown in the drawing, communication is performed in a wired manner using the transmission cable 11400. However, communication between the camera head 11102 and the CCU 11201 may be performed in a wireless manner.

An example of an endoscopic surgery system to which the technique according to the present disclosure can be applied has been described above. The technology according to the present disclosure can be applied to the imaging unit 11402 of the camera head 11102. Specifically, the solid-state imaging device 1 in FIG. 1 can be applied to the imaging unit 11402. With this solid-state imaging device 1, it is possible to reduce defects in electrode bonding when stacking and bonding two substrates.

9. Example Applications to Moving Objects

The technology (the present technology) according to the present disclosure can be applied to various products. For example, the technology according to the present disclosure may be embodied as an apparatus mounted on any type of moving object, such as an automobile, an electrical vehicle, a hybrid electrical vehicle, a motorcycle, a bicycle, a personal mobility device, an airplane, a drone, a vessel, or a robot.

Figure 17:
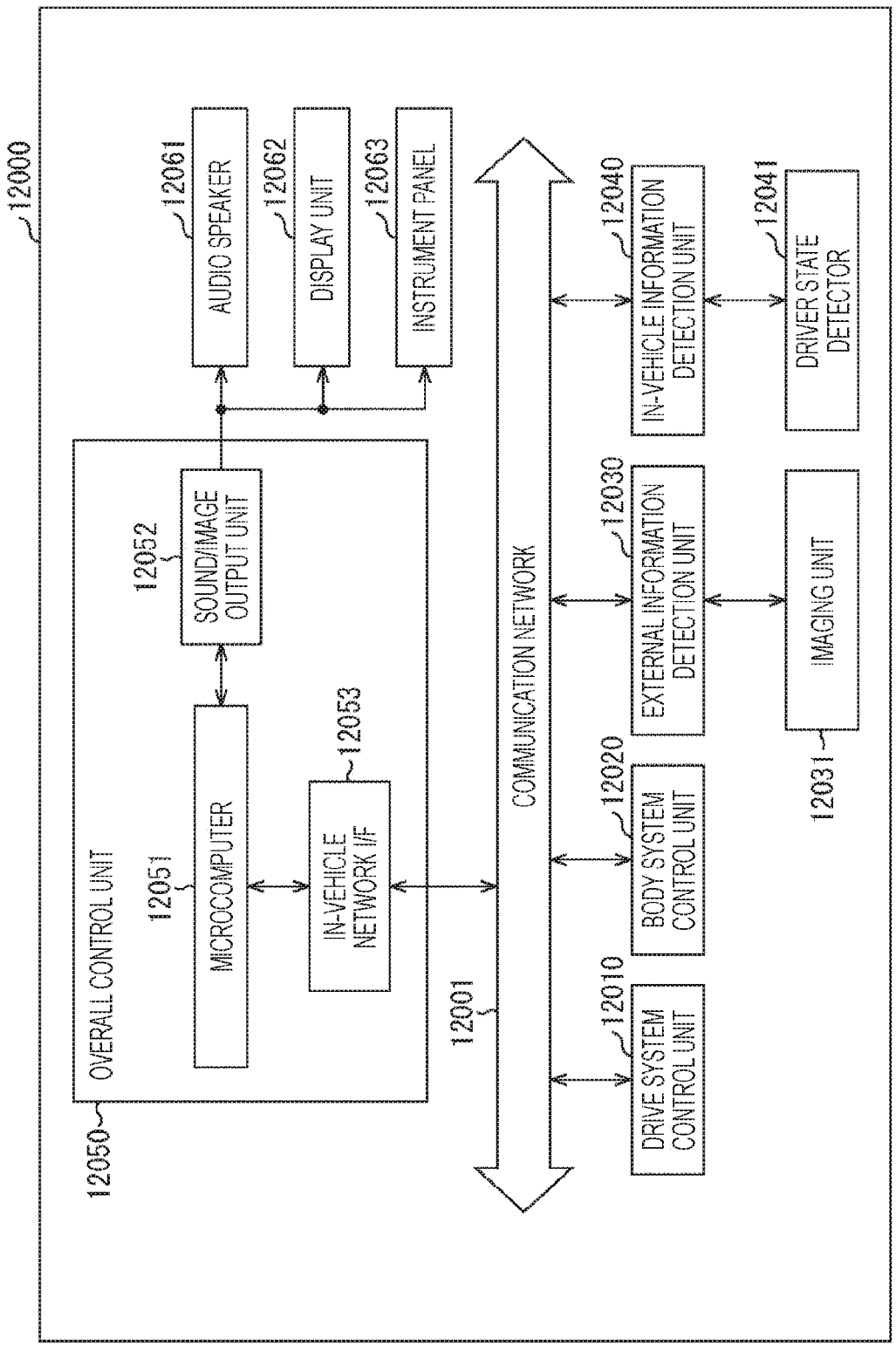

FIG. 17 is a block diagram schematically showing an example configuration of a vehicle control system that is an example of a moving object control system to which the technology according to the present disclosure may be applied.

The vehicle control system 12000 includes a plurality of electronic control units connected via a communication network 12001. In the example shown in FIG. 17, the vehicle control system 12000 includes a drive system control unit 12010, a body system control unit 12020, an external information detection unit 12030, an in-vehicle information detection unit 12040, and an overall control unit 12050. Further, a microcomputer 12051, a sound/image output unit 12052, and an in-vehicle network interface (I/F) 12053 are also shown as the functional components of the overall control unit 12050.

The drive system control unit 12010 controls operations of the devices related to the drive system of the vehicle according to various programs. For example, the drive system control unit 12010 functions as control devices such as a driving force generation device for generating a driving force of the vehicle such as an internal combustion engine or a driving motor, a driving force transmission mechanism for transmitting the driving force to the wheels, a steering mechanism for adjusting the steering angle of the vehicle, and a braking device for generating a braking force of the vehicle.

The body system control unit 12020 controls operations of the various devices mounted on the vehicle body according to various programs. For example, the body system control unit 12020 functions as a keyless entry system, a smart key system, a power window device, or a control device for various lamps such as a headlamp, a backup lamp, a brake lamp, a turn signal lamp, a fog lamp, or the like. In this case, the body system control unit 12020 can receive radio waves transmitted from a portable device that substitutes for a key, or signals from various switches. The body system control unit 12020 receives inputs of these radio waves or signals, and controls the door lock device, the power window device, the lamps, and the like of the vehicle.

The external information detection unit 12030 detects information outside the vehicle equipped with the vehicle control system 12000. For example, an imaging unit 12031 is connected to the external information detection unit 12030. The external information detection unit 12030 causes the imaging unit 12031 to capture an image of the outside of the vehicle, and receives the captured image. On the basis of the received image, the external information detection unit 12030 may perform an object detection process for detecting a person, a vehicle, an obstacle, a sign, characters on the road surface, or the like, or perform a distance detection process.

The imaging unit 12031 is an optical sensor that receives light, and outputs an electrical signal corresponding to the amount of received light. The imaging unit 12031 can output an electrical signal as an image, or output an electrical signal as distance measurement information. Further, the light to be received by the imaging unit 12031 may be visible light, or may be invisible light such as infrared rays.

The in-vehicle information detection unit 12040 detects information about the inside of the vehicle. For example, a driver state detector 12041 that detects the state of the driver is connected to the in-vehicle information detection unit 12040. The driver state detector 12041 includes a camera that captures an image of the driver, for example, and, on the basis of detected information input from the driver state detector 12041, the in-vehicle information detection unit 12040 may calculate the degree of fatigue or the degree of concentration of the driver, or determine whether the driver is dozing off.

On the basis of the external/internal information acquired by the external information detection unit 12030 or the in-vehicle information detection unit 12040, the microcomputer 12051 can calculate the control target value of the driving force generation device, the steering mechanism, or the braking device, and output a control command to the drive system control unit 12010. For example, the microcomputer 12051 can perform cooperative control to achieve the functions of an advanced driver assistance system (ADAS), including vehicle collision avoidance or impact mitigation, follow-up running based on the distance between vehicles, vehicle speed maintenance running, vehicle collision warning, vehicle lane deviation warning, or the like.

Further, the microcomputer 12051 can also perform cooperative control to conduct automatic driving or the like for autonomously running not depending on the operation of the driver, by controlling the driving force generation device, the steering mechanism, the braking device, or the like on the basis of information about the surroundings of the vehicle, the information having being acquired by the external information detection unit 12030 or the in-vehicle information detection unit 12040.

Further, the microcomputer 12051 can also output a control command to the body system control unit 12020, on the basis of the external information acquired by the external information detection unit 12030. For example, the microcomputer 12051 controls the headlamp in accordance with the position of the leading vehicle or the oncoming vehicle detected by the external information detection unit 12030, and performs cooperative control to achieve an anti-glare effect by switching from a high beam to a low beam, or the like.

The sound/image output unit 12052 transmits an audio output signal and/or an image output signal to an output device that is capable of visually or audibly notifying the passenger(s) of the vehicle or the outside of the vehicle of information. In the example shown in FIG. 17, an audio speaker 12061, a display unit 12062, and an instrument panel 12063 are shown as output devices. The display unit 12062 may include an on-board display and/or a head-up display, for example.

Figure 18:
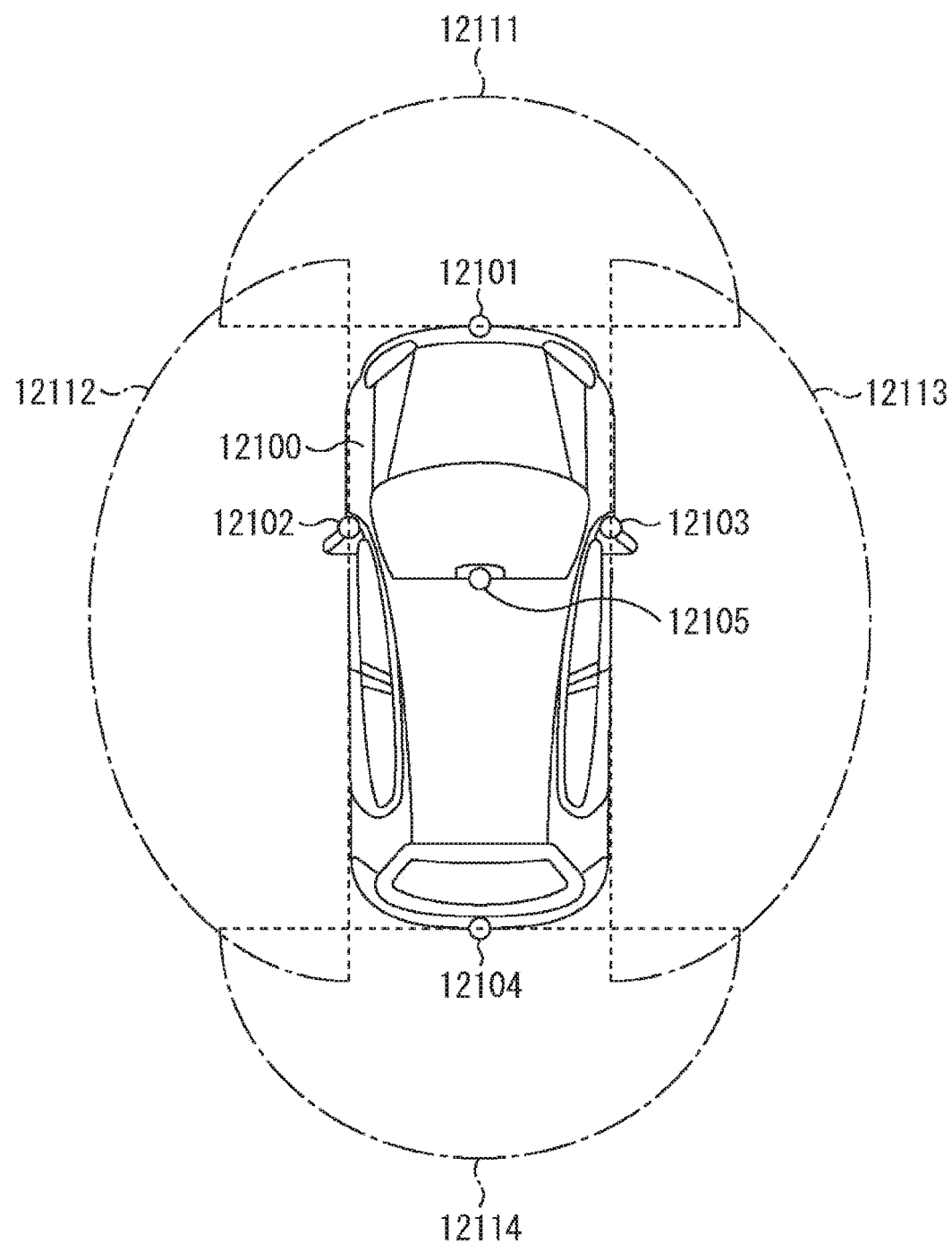

FIG. 18 is a diagram showing an example of installation positions of imaging units 12031.

In FIG. 18, a vehicle 12100 includes imaging units 12101, 12102, 12103, 12104, and 12105 as the imaging units 12031.

Imaging units 12101, 12102, 12103, 12104, and 12105 are provided at the following positions: the front end edge of a vehicle 12100, a side mirror, the rear bumper, a rear door, an upper portion, and the like of the front windshield inside the vehicle, for example. The imaging unit 12101 provided on the front end edge and the imaging unit 12105 provided on the upper portion of the front windshield inside the vehicle mainly capture images ahead of the vehicle 12100. The imaging units 12102 and 12103 provided on the side mirrors mainly capture images on the sides of the vehicle 12100. The imaging unit 12104 provided on the rear bumper or a rear door mainly captures images behind the vehicle 12100. The front images acquired by the imaging units 12101 and 12105 are mainly used for detection of a vehicle running in front of the vehicle 12100, a pedestrian, an obstacle, a traffic signal, a traffic sign, a lane, or the like.

Note that FIG. 18 shows an example of the imaging ranges of the imaging units 12101 through 12104. An imaging range 12111 indicates the imaging range of the imaging unit 12101 provided on the front end edge, imaging ranges 12112 and 12113 indicate the imaging ranges of the imaging units 12102 and 12103 provided on the respective side mirrors, and an imaging range 12114 indicates the imaging range of the imaging unit 12104 provided on the rear bumper or a rear door. For example, image data captured by the imaging units 12101 through 12104 are superimposed on one another, so that an overhead image of the vehicle 12100 viewed from above is obtained.

At least one of the imaging units 12101 through 12104 may have a function of acquiring distance information. For example, at least one of the imaging units 12101 through 12104 may be a stereo camera including a plurality of imaging devices, or may be an imaging device having pixels for phase difference detection.

For example, in accordance with distance information obtained from the imaging units 12101 through 12104, the microcomputer 12051 calculates the distances to the respective three-dimensional objects within the imaging ranges 12111 through 12114, and temporal changes in the distances (the speeds relative to the vehicle 12100). In this manner, the three-dimensional object that is the closest three-dimensional object on the traveling path of the vehicle 12100 and is traveling at a predetermined speed (0 km/h or higher, for example) in substantially the same direction as the vehicle 12100 can be extracted as the vehicle running in front of the vehicle 12100. Further, the microcomputer 12051 can set beforehand an inter-vehicle distance to be maintained in front of the vehicle running in front of the vehicle 12100, and can perform automatic brake control (including follow-up stop control), automatic acceleration control (including follow-up start control), and the like. In this manner, it is possible to perform cooperative control to conduct automatic driving or the like to autonomously travel not depending on the operation of the driver.

For example, in accordance with the distance information obtained from the imaging units 12101 through 12104, the microcomputer 12051 can extract three-dimensional object data concerning three-dimensional objects under the categories of two-wheeled vehicles, regular vehicles, large vehicles, pedestrians, utility poles, and the like, and use the three-dimensional object data in automatically avoiding obstacles. For example, the microcomputer 12051 classifies the obstacles in the vicinity of the vehicle 12100 into obstacles visible to the driver of the vehicle 12100 and obstacles difficult to visually recognize. Then, the microcomputer 12051 then determines collision risks indicating the risks of collision with the respective obstacles. If a collision risk is equal to or higher than a set value, and there is a possibility of collision, the microcomputer 12051 can output a warning to the driver via the audio speaker 12061 and the display unit 12062, or can perform driving support for avoiding collision by performing forced deceleration or avoiding steering via the drive system control unit 12010.

At least one of the imaging units 12101 through 12104 may be an infrared camera that detects infrared rays. For example, the microcomputer 12051 can recognize a pedestrian by determining whether or not a pedestrian exists in images captured by the imaging units 12101 through 12104. Such pedestrian recognition is carried out through a process of extracting feature points from the images captured by the imaging units 12101 through 12104 serving as infrared cameras, and a process of performing a pattern matching on the series of feature points indicating the outlines of objects and determining whether or not there is a pedestrian, for example. If the microcomputer 12051 determines that a pedestrian exists in the images captured by the imaging units 12101 through 12104, and recognizes a pedestrian, the sound/image output unit 12052 controls the display unit 12062 to display a rectangular contour line for emphasizing the recognized pedestrian in a superimposed manner. Further, the sound/image output unit 12052 may also control the display unit 12062 to display an icon or the like indicating the pedestrian at a desired position.

An example of a vehicle control system to which the technology according to the present disclosure can be applied has been described above. The technology according to the present disclosure can be applied to the imaging unit 12031 in the above described configuration. Specifically, the solid-state imaging device 1 in FIG. 1 can be applied to the imaging unit 12031. With this solid-state imaging device 1, it is possible to reduce defects in electrode bonding when stacking and bonding two substrates.

Note that the present technology may also be embodied in the configurations described below.

(1)

A solid-state imaging device including:

a first substrate including a first electrode formed with a metal; and a second substrate that is a substrate bonded to the first substrate, the second substrate including a second electrode formed with a metal, the second electrode being bonded to the first electrode, in which, in at least one of the first substrate or the second substrate, a diffusion preventing layer of the metal is formed for a layer formed with the metal filling a hole portion, the metal forming the electrodes.

(2)

The solid-state imaging device according to (1), in which the diffusion preventing layer includes a diffusion preventing film formed between a first layer in which the metal is buried in a first hole portion, and a second layer in which the metal is buried in a second hole portion to form a connecting pad portion.

(3)

The solid-state imaging device according to (1) or (2), in which the diffusion preventing layer includes a metal seed film formed between a first layer in which the metal is buried in a first hole portion, and a second layer in which the metal is buried in a second hole portion to form a connecting pad portion.

(4)

The solid-state imaging device according to (3), in which the metal seed film is also formed between a side surface of the first hole portion and the metal, and between a side surface of the second hole portion and the metal.

(5)

The solid-state imaging device according to any one of (2) to (4), in which a diameter of the second hole portion in the second layer is smaller than a diameter of the first hole portion in the first layer.

(6)

The solid-state imaging device according to (5), in which the diameter of the first hole portion and the diameter of the second hole portion have the same shape or different shapes.

(7)

The solid-state imaging device according to any one of (2) to (6), in which, in the second layer, a diameter of the second hole portion is smaller in a surface on the opposite side from a bonding surface than in the bonding surface.

(8)

The solid-state imaging device according to (2), in which the diffusion preventing film is an insulating film.

(9)

The solid-state imaging device according to (8), in which the insulating film is a film using silicon nitride (SiN), silicon carbonitride (SiCN), or silicon carbide (SiC).

(10)

The solid-state imaging device according to (3) or (4), in which the metal seed film is a film using tantalum (Ta) or titanium (Ti).

(11)

The solid-state imaging device according to any one of (1) to (10), in which the metal forming the first electrode and the second electrode is copper (Cu).

(12)

The solid-state imaging device according to any one of (1) to (11), in which the diffusion preventing layer is a layer for preventing diffusion of the metal at a time of heat treatment after bonding of bonding surfaces of the first substrate and the second substrate.

(13)

The solid-state imaging device according to any one of (1) to (12), in which the first substrate is a sensor substrate having a pixel region in which a plurality of pixels including a photoelectric conversion unit are two-dimensionally arranged, and the second substrate is a circuit substrate including a predetermined circuit.

(14)

A method for manufacturing a solid-state imaging device that includes:

a first substrate including a first electrode formed with a metal; and a second substrate that is a substrate bonded to the first substrate, the second substrate including a second electrode formed with a metal, the second electrode being bonded to the first electrode, the method including:

forming a first layer in which the metal is buried in a first hole portion;

forming a diffusion preventing layer of the metal, the diffusion preventing layer being stacked on the first layer; and forming a second layer in which the metal is buried in a second hole portion to form a connecting pad portion, the second layer being stacked on the first layer and the diffusion preventing layer, the first layer, the diffusion preventing layer, and the second layer being formed in at least one of the first substrate or the second substrate.

REFERENCE SIGNS LIST

1 Solid-state imaging device
11 First substrate
11S Bonding surface
12 Pixel
13 Pixel region
14 Pixel drive line
15 Vertical signal line
21 Second substrate
21S Bonding surface
22 Vertical drive circuit
23 Column signal processing circuit
24 Horizontal drive circuit
25 System control circuit
100 Laminated film
100-1 First layer
100-2 Second layer
100-3 Diffusion preventing layer
101 Interlayer insulating film
102 Diffusion preventing film
103 Interlayer insulating film
104-1, 104-2 Metal seed film
105-1, 105-2 Metallic film
111 Via
112 Via
121 Pad portion
1000 Imaging apparatus
1001 Solid-state imaging device
10112 Imaging unit
12031 Imaging unit

The invention claimed is:

1. A solid-state imaging device, comprising:
a first substrate that includes a first electrode, wherein the first electrode includes a metal; and
a second substrate bonded to the first substrate, wherein the second substrate includes a second electrode, wherein the second electrode includes the metal,
the second electrode is bonded to the first electrode, and
at least one of the first substrate or the second substrate includes:
a first layer that includes a first metal seed film and a first hole portion, wherein the first hole portion includes the metal;
a diffusion preventing layer on a surface of the first layer; and
a second layer on the surface of the first layer, wherein
the second layer includes a second metal seed film,
the diffusion preventing layer is between the first layer and the second layer,
the diffusion preventing layer includes a portion of the second metal seed film,
the first metal seed film includes:
a first region; and
a second region spaced apart from the first region, and
each of the first region and the second region of the first metal seed film is in contact with the portion of the second metal seed film in the diffusion preventing layer.

2. The solid-state imaging device according to claim 1, wherein
the second layer includes a second hole portion,
the second hole portion includes the metal, and
the second hole portion that includes the metal is a connecting pad portion.

3. The solid-state imaging device according to claim 2, wherein
the first metal seed film is between a side surface of the first hole portion and the metal in the first hole portion, and
the second metal seed film is between a side surface of the second hole portion and the metal in the second hole portion.

4. The solid-state imaging device according to claim 2, wherein a diameter of the second hole portion in the second layer is greater than a diameter of the first hole portion in the first layer.

5. The solid-state imaging device according to claim 4, wherein the diameter of the first hole portion has a shape different from the diameter of the second hole portion.

6. The solid-state imaging device according to claim 2, wherein the second layer further includes a bonding surface opposite to the diffusion preventing layer.

7. The solid-state imaging device according to claim 2, wherein the diffusion preventing layer further includes an insulating film.

8. The solid-state imaging device according to claim 7, wherein the insulating film includes silicon oxide.

9. The solid-state imaging device according to claim 3, wherein the first metal seed film includes one of tantalum (Ta) or titanium (Ti).

10. The solid-state imaging device according to claim 1, wherein the first electrode and the second electrode include copper (Cu).

11. The solid-state imaging device according to claim 1, wherein
the diffusion preventing layer is for prevention of diffusion of the metal at a time of heat treatment after the first substrate is bonded to the second substrate.

12. The solid-state imaging device according to claim 1, wherein
the first substrate is a sensor substrate having a pixel region,
the pixel region includes a plurality of pixels,
each of the plurality of pixels includes a photoelectric conversion unit,
pixels of the plurality of pixels are in a two-dimensional arrangement, and
the second substrate is a circuit substrate including a determined circuit.

* * * * *